(12) United States Patent
Gong

(10) Patent No.: US 11,335,572 B2
(45) Date of Patent: May 17, 2022

(54) TRANSITION DEVICE FOR FLEXIBLE DEVICE AND PRODUCTION METHOD THEREFOR, AND METHOD FOR FABRICATING FLEXIBLE DEVICE

(71) Applicant: INSTITUTE OF FLEXIBLE ELECTRONICS TECHNOLOGY OF THU, ZHEJIANG, Zhejiang (CN)

(72) Inventor: Yunping Gong, Zhejiang (CN)

(73) Assignee: INSTITUTE OF FLEXIBLE ELECTRONICS TECHNOLOGY OF THU, ZHEJIANG, Zhejiang (CN)

( * ) Notice: Subject to any disclaimer, the term of this patent is extended or adjusted under 35 U.S.C. 154(b) by 0 days.

(21) Appl. No.: 17/038,701

(22) Filed: Sep. 30, 2020

(65) Prior Publication Data

US 2021/0013054 A1      Jan. 14, 2021

Related U.S. Application Data

(63) Continuation of application No. PCT/CN2019/073281, filed on Jan. 26, 2019.

(30) Foreign Application Priority Data

May 31, 2018   (CN) .......................... 201810549408.2
May 31, 2018   (CN) .......................... 201810550634.2
May 31, 2018   (CN) .......................... 201810550646.5

(51) Int. Cl.
*H01L 21/56*       (2006.01)
*H01L 21/683*      (2006.01)
(Continued)

(52) U.S. Cl.
CPC ........ *H01L 21/563* (2013.01); *H01L 21/6835* (2013.01); *H01L 23/31* (2013.01); *H01L 24/97* (2013.01); *H05K 1/118* (2013.01)

(58) Field of Classification Search
CPC ... H01L 21/563; H01L 21/6835; H01L 23/31; H01L 24/97; H01L 23/3128;
(Continued)

(56) References Cited

U.S. PATENT DOCUMENTS 6,559,905 B1 *   5/2003   Akiyama ................ H01L 24/82
                                                       349/45
7,834,359 B2 *  11/2010   Kimura ................... H01L 24/95
                                                       257/72
(Continued)

FOREIGN PATENT DOCUMENTS

WO         2017123780          7/2017

OTHER PUBLICATIONS

WIPO, ISR for PCT/CN2019/073281, Mar. 29, 2019.
EPO, Partial Supplementary European Search Report for EP Application No. 19811822.6, dated Feb. 2, 2022.

*Primary Examiner* — Vu A Vu
(74) *Attorney, Agent, or Firm* — Hodgson Russ LLP

(57) ABSTRACT

A transition device for a flexible device and a production method therefor, and a method for fabricating a flexible device are provided. The transition device includes a functional component and a transition base. The functional component has a first surface for mounting with a base and a second surface opposite to the first surface, and the transition base is bonded to the second surface of the functional component by an adhesive layer.

21 Claims, 25 Drawing Sheets

(51) Int. Cl.
*H01L 23/31* (2006.01)
*H01L 23/00* (2006.01)
*H05K 1/11* (2006.01)

(58) Field of Classification Search
CPC . H01L 2221/68381; H01L 2221/68368; H01L 21/561; H01L 21/568; H01L 27/32; H01L 21/31; H01L 21/56; H01L 21/52; H01L 21/78; H01L 24/05; H01L 2221/68313; H01L 2221/68377; H05K 1/118
USPC .......................................................... 257/778
See application file for complete search history.

(56) References Cited

U.S. PATENT DOCUMENTS

| | | | |
|---|---|---|---|
| 8,395,908 B2* | 3/2013 | Kim | H01L 23/3121 |
| | | | 361/809 |
| 8,943,677 B2* | 2/2015 | Gerster | C22C 38/14 |
| | | | 29/609 |
| 2016/0330837 A1* | 11/2016 | Coleman | H01L 24/24 |
| 2018/0096877 A1 | 4/2018 | Horibe | |
| 2019/0057891 A1 | 2/2019 | Marinov et al. | |

* cited by examiner

TRANSITION DEVICE FOR FLEXIBLE DEVICE AND PRODUCTION METHOD THEREFOR, AND METHOD FOR FABRICATING FLEXIBLE DEVICE

CROSS-REFERENCE TO RELATED APPLICATION

This application is a continuation of International Application No. PCT/CN2019/073281, filed Jan. 26, 2019, which claims priority to Chinese Patent Application No. 201810549408.2, filed May 31, 2018, Chinese Patent Application No. 201810550634.2, filed May 31, 2018, and Chinese Patent Application No. 201810550646.5, filed May 31, 2018. The entire disclosures of the aforementioned patent applications are incorporated herein by reference.

FIELD

The present disclosure relates to the field of chip packaging, and more particularly to a transition device for a flexible device and a production method therefor, and a fabricating method for a flexible device.

BACKGROUND

In recent years, with the continuous development and progress of flexible electronic technologies and the increasing application of smart wearable products, flexible electronic devices have a wide application prospect due to their unique advantages such as flexibility, ductility, light weight, and thin thickness.

SUMMARY

The present disclosure provides a transition device for a flexible device and a production method therefor, and a fabricating method for a flexible device. The transition device for the flexible device can better protect functional components to facilitate transportation, avoid damages to the functional components during the transportation process, and facilitate subsequent mounting applications of the functional components, such that the transition device can be directly applied in the manufacture of flexible electronic products.

The present disclosure provides a transition device for a flexible device. The transition device includes a functional component and a transition base. The functional component has a first surface for mounting with a base and a second surface opposite to the first surface, and the transition base is bonded to the second surface of the functional component by an adhesive layer.

Further, the functional component is an IC chip or a flexible component based on a polymer substrate.

Further, the functional component includes a functional component body and a packaging layer, in which the functional component body includes a substrate and a functional layer formed at a surface of the substrate, and the packaging layer is at least disposed on a surface of the functional layer.

Further, when the functional component is applicable to a normal chip process, the transition base is bonded with the functional component at the second surface thereof where the functional layer is located by the adhesive layer. Alternatively, when the functional component is applicable to a flip chip process, the transition base is bonded with the functional component at the second surface thereof away from the functional layer by the adhesive layer.

Further, the functional layer includes a PAD provided with a flexible electrode thereon, in which the flexible electrode is drawn from the PAD, penetrated through the packaging layer and exposed on a surface of the packaging layer.

Further, when the functional component is an IC chip, the functional component body includes an IC chip substrate and a circuit functional layer formed on the IC chip substrate, and the packaging layer encapsulates the IC chip substrate and the circuit functional layer at least from a surface of the circuit functional layer and a side of the IC chip.

Further, when the IC chip is applicable to a normal chip process, the transition base is bonded with the IC chip at a surface thereof where the circuit functional layer is located by the adhesive layer. Alternatively, when the IC chip is applicable to a flip chip process, the transition base is bonded with the IC chip at a surface thereof away from the circuit functional layer by the adhesive layer.

Further, when the functional component is a flexible component based on a polymer substrate, the functional component includes a substrate layer and a device functional layer disposed on the substrate layer, in which the device functional layer is encapsulated by the packaging layer.

Further, the flexible component based on the polymer substrate is applicable to a normal chip process, and the transition base is bonded with the flexible component based on the polymer substrate at a surface thereof where the device functional layer is located by the adhesive layer. Alternatively, the flexible component based on the polymer substrate is applicable to a flip chip process, and the transition base is bonded with the flexible component based on the polymer substrate at a surface thereof where the substrate layer is located by the adhesive layer.

Further, the substrate layer is an organic polymer layer, or includes organic polymer layers and inorganic material layers alternately arranged.

Further, the packaging layer is formed by an organic polymer or an inorganic material or a mixture thereof, or includes organic polymer layers and inorganic material layers alternately arranged.

Further, the thickness of the packaging layer formed by the organic polymer is in a range of 200 nm to 10000 nm.

Further, the thickness of the packaging layer formed by the inorganic material is in a range of 5 nm to 600 nm.

Further, the adhesive layer has a first adhesive surface for bonding with the transition base and a second adhesive surface for bonding with the functional component, and the adhesive force between the first adhesive surface and the transition base is greater than that between the second adhesive surface and the functional component.

Further, a plurality of concave-convex structures for increasing an adhesive area are formed on the transition base, and located on a surface of the transition base in contact with the adhesive layer.

Further, the adhesive layer includes a first adhesive layer in contact with the transition base and a second adhesive layer in contact with the functional component. The first adhesive surface is formed between the first adhesive layer and the transition base, and the second adhesive surface is formed between the second adhesive layer and the functional component.

Further, in the case of applying modifying influence factors to the adhesive layer, the viscosity of the first adhesive layer is increased, and/or the viscosity of the second adhesive layer is reduced, such that the viscosity of the first adhesive layer is greater than that of the second adhesive layer.

Further, the adhesive layer further includes a buffer layer disposed between the first adhesive layer and the second adhesive layer, and two surfaces of the buffer layer are bonded with the first adhesive layer and the second adhesive layer, respectively.

Further, the buffer layer is made of a low thermal conductivity material with a thermal conductivity of less than 0.5.

Further, the transition device for the flexible device further includes a chip bonding film formed on a surface of the functional component away from the transition base.

Further, the viscosity of the chip bonding film is greater than that of the adhesive layer.

Further, the transition device for the flexible device further includes an image microstructure formed on a surface of the transition base away from the functional component.

The present disclosure further provides a method for producing the transition device for the flexible device as described above, including: providing a functional component body; forming a packaging layer outside the functional component body to form a functional component, the functional component having a first surface for mounting with a flexible base and a second surface opposite to the first surface; and providing and bonding a transition base to the second surface of the functional component by an adhesive layer.

Further, the functional component is an IC chip or a flexible component based on a polymer substrate.

Further, the method further includes fabricating and thickening a PAD at a corresponding position of the functional layer before forming the packaging layer.

Further, the method further includes fabricating a flexible electrode on the PAD, in which the flexible electrode is drawn from the PAD, penetrated through the packaging layer and exposed on a surface of the packaging layer.

Further, when the functional component is an IC chip, the method includes: providing a wafer and forming a circuit functional layer on the wafer; dicing the wafer to form a plurality of IC chip substrates and a functional component body of the circuit functional layer on the IC chip substrate; encapsulating the functional component body to form the IC chip, in which the IC chip has a first surface for mounting with a base and a second surface opposite to the first surface; providing and bonding a transition blank to the second surface of the IC chip by an adhesive layer; and dicing the transition blank.

Further, forming the circuit functional layer on the wafer includes thickening a PAD of an I/O port of the circuit functional layer, and forming the packaging layer includes fabricating a flexible electrode at a position of the packaging layer corresponding to the PAD.

Further, the method further includes thinning the IC chip to enable the thickness of the IC chip substrate to be less than 80 μm.

Further, when the IC chip is applicable to a normal chip process, after bonding the transition blank to the second surface of the IC chip by the adhesive layer, a silicon substrate on a surface of the IC chip away from the transition blank is thinned immediately.

Further, after thinning the IC chip, the method further includes encapsulating the thinned surface of the IC chip.

Further, thinning the IC chip applicable to a flip chip process includes: providing an adapter plate, and bonding the adapter plate to the first surface of the IC chip applicable to the flip chip process by an adapter adhesive layer; thinning the IC chip substrate; bonding the transition blank by an adhesive layer to the thinned surface of the IC chip applicable to the flip chip process; and peeling the adapter plate and the adapter adhesive layer.

Further, the adhesive force between the adapter adhesive layer and the IC chip is smaller than that between the adhesive layer and the IC chip.

Further, after thinning the IC chip, the method further includes eliminating residual stress at the thinned surface of the IC chip substrate.

Further, when the functional component is a flexible component based on a polymer substrate, the method includes: providing a substrate blank and forming a plurality of device functional layers on the substrate blank; encapsulating the device functional layers to form a flexible component blank based on the polymer substrate, in which the flexible component blank based on the polymer substrate has a first surface for mounting with a base and a second surface opposite to the first surface; providing and bonding a transition blank to the second surface of the flexible component blank based on the polymer substrate by the adhesive layer; and dicing the flexible component blank based on the polymer substrate to form flexible components based on the polymer substrate.

Further, forming a plurality of device functional layers on the substrate blank includes: thickening a PAD of the flexible component based on the polymer substrate and fabricating a flexible electrode on the PAD of the flexible component based on the polymer substrate, such that the PAD of the flexible component based on the polymer substrate is drawn from the packaging layer.

Further, the flexible component based on the polymer substrate is applicable to a normal chip process, and the transition blank is bonded with the flexible component based on the polymer substrate at a surface thereof where the device functional layer is located by the adhesive layer. Alternatively, the flexible component based on the polymer substrate is applicable to a flip chip process, and the transition blank is bonded with the flexible component based on the polymer substrate at a surface thereof where the substrate blank is located by the adhesive layer.

Further, the adhesive layer has a first adhesive surface for bonding with the transition blank and a second adhesive surface for bonding with the flexible component based on the polymer substrate, and the adhesive force between the first adhesive surface and the transition blank is greater than that between the second adhesive surface and the functional component.

Further, the method further includes forming a chip bonding film on the first surface of the functional component.

The present disclosure further provides a method for mounting a flexible device using the above mentioned transition device for the flexible device. The method includes: providing a flexible base and mounting the first surface of the functional component in the transition device of the flexible device to the flexible base.

Further, the method further includes disposing a chip bonding film on the first surface of the functional component and/or on the flexible base.

The present disclosure further provides a method for fabricating a flexible device. The method includes: providing the transition device for the flexible device described above; providing a flexible base and moving the transition device to bond the flexible base with the functional component at the first surface thereof; and mounting the first surface of the functional component in the transition device of the flexible device on the flexible base, and peeling the transition base and the adhesive layer.

Further, the adhesive layer has a first adhesive surface for bonding with the transition base and a second adhesive surface for bonding with the functional component, and the adhesive force between the first adhesive surface and the transition base is greater than that between the second adhesive surface and the functional component.

Further, in the case of applying modifying influence factors to the adhesive layer, the adhesive force between the first adhesive surface and the transition base is greater than that between the second adhesive surface and the functional component.

Further, the adhesive layer includes a first adhesive layer in contact with the transition base and a second adhesive layer in contact with the functional component, and the first adhesive surface is formed between the first adhesive layer and the transition base, and the second adhesive surface is formed between the second adhesive layer and the functional component. Moreover, in removing the transition base and the adhesive layer, by applying modifying influence factors to the adhesive layer, the viscosity of the first adhesive layer is increased, and/or the viscosity of the second adhesive layer is reduced, such that the viscosity of the first adhesive layer is greater than that of the second adhesive layer.

Further, the first adhesive layer is formed by a heat sensitive adhesive, where the viscosity of the first adhesive layer is increased by application of a temperature; and/or the second adhesive layer is formed by a heat sensitive adhesive, where the viscosity of the second adhesive layer is reduced by application of a temperature.

Further, the first adhesive layer is formed by an ultraviolet sensitive adhesive, where the viscosity of the first adhesive layer is increased by irradiating with ultraviolet light; and/or the second adhesive layer is formed by an ultraviolet sensitive adhesive, where the viscosity of the second adhesive layer is reduced by irradiating with ultraviolet light.

Further, the viscosity of the second adhesive layer is reduced by applying modifying influence factors, and the first adhesive is a permanent adhesive.

Further, in removing the transition base and the adhesive layer, the method further includes applying modifying influence factors to the adhesive layer to reduce the adhesive force between the adhesive layer and the functional component, and/or increase the adhesive force between the adhesive layer and the transition base.

Further, the method for producing the flexible device further includes fabricating the transition device for the flexible device by the method for producing the transition device for the flexible device as described above.

Further, the method for producing the flexible device further includes disposing a chip bonding film on the first surface of the functional component and/or on the flexible substrate, and connecting the flexible base with the functional component at the first surface thereof by the chip bonding film.

DETAILED DESCRIPTION

In order to further illustrate the technological means and effectiveness of the disclosure taken to achieve a predetermined inventive purpose, it will be illustrated in detail in the following in combination with drawings and preferred embodiments.

Functional components, the key of flexible electronic products, include (integrated circuit) IC chips based on substrates made of traditional semiconductor materials (such as Si, SiC and GaAs), and emerging flexible components based on polymer substrates, such as resistors, capacitors, sensors, and biological micro-electro-mechanical systems (MEMSs). Flexible components based on polymer substrates are important functional components to realize the functions of flexible electronic products. In the fabricating process of flexible electronic products, the IC chips are generally bonded on flexible bases or substrates by mounting, and flexible components based on polymer substrates are generally fabricated on flexible bases or substrates by pressing or printing techniques. The traditional IC chips are not compatible with the fabricating process and equipment of flexible components based on polymer substrates, and the equipment required for pressing or printing techniques is complicated and costly, which is not conducive to the development of the flexible electronic product industry.

In addition, in the pressing or printing process, since all the flexible components based on the polymer substrate are formed on a flexible base, the failure of one flexible component based on the polymer substrate will affect the function of the entire flexible electronic product. It is difficult to replace a single faulty flexible component based on the polymer substrate, which is not conducive to the screening of the device, and has a serious impact on the yield of the product.

The present disclosure provides a transition device for a flexible device and a production method therefor, and a method for fabricating a flexible device. The transition device for the flexible device can better protect functional components, facilitate transportation, avoid damage to the functional components during the transportation process, and facilitate subsequent mount applications of the functional components, such that the transition device can be directly applied in the manufacture of flexible electronic products.

In the present disclosure, the functional component includes an IC chip and a flexible component based on a flexible polymer substrate, in which the IC chip is an integrated circuit with a substrate made of a semiconductor material such as Si, SiC, GaAs or the like, and the flexible component based on the polymer substrate is a functional component such as a capacitor, a resistor, a sensor or a biological micro-electro-mechanical system (bio-MEMS) with a flexible polymer substrate.

Figure 1:
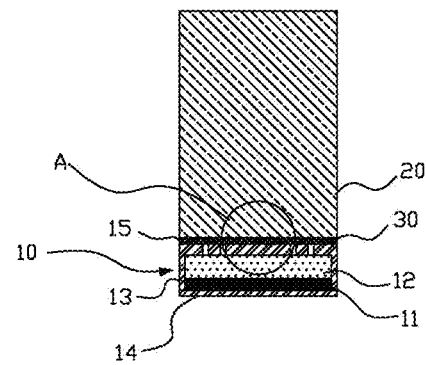
FIG. 1 is a schematic view of a transition device for a flexible device according to a first embodiment of the present disclosure.

As shown in FIG. 1, a transition device for a flexible device provided by a first embodiment of the present disclosure includes an IC chip 10 and a transition base 20. The transition base 20 and the IC chip 10 are bonded by an adhesive layer 30.

The IC chip 10 includes an IC chip substrate 11, a circuit functional layer 12 formed on the IC chip substrate 11, and a packaging layer 13 for encapsulating the IC chip substrate 11 and the circuit functional layer 12.

In this embodiment, the IC chip substrate 11 may be a thinned IC chip substrate 11 by a thinning process. Taking silicon on insulator (SOI) as an example, the thinning is performed such that the thickness of the IC chip substrate 11 is less than 80 μm. Alternatively, a silicon substrate 113 and a buried oxide layer 112 are directly removed to only retain the top silicon layer 111 (FIG. 1 shows only the retained top silicon layer 111).

In other embodiments, the IC chip 10 may also be a thinned bulk silicon wafer, i.e. a single crystal silicon wafer or a silicon rod.

The IC chip 10 has a first surface 14 for mounting with a base, such as a flexible base 40, and a second surface 15 opposite to the first surface 14 on the IC chip 10. In a normal chip process, when the IC chip 10 is fixed on the flexible base 40, the circuit functional layer 12 of the IC chip 10 faces away from the flexible base 40, i.e. the surface where the circuit functional layer 12 is located is taken as the second surface 15 of the IC chip 10, and the surface where the IC chip substrate 11 is located is taken as the first surface 14 of the IC chip 10. In a flip chip process, when the IC chip 10 is fixed on the flexible base 40, the circuit functional layer 12 of the IC chip 10 faces towards the flexible base 40, i.e. the surface where the circuit functional layer 12 is located is taken as the first surface 14 of the IC chip 10, and the surface where the IC chip substrate 11 is located is taken as the second surface 15 of the IC chip 10.

The packaging layer 13 encapsulates the IC chip 10 at least from a surface of the circuit functional layer 12 and sides of the IC chip 10. In other embodiments, the packaging layer 13 also encapsulates a surface of the IC chip 10 away from the circuit functional layer 12, that is, encapsulates all the surfaces of the IC chip 10. When the packaging layer 13 is located on the surface of the circuit functional layer 12, the circuit functional layer 12 includes a PAD, and the PAD of the circuit functional layer 12 is exposed from the packaging layer 13.

The packaging layer 13 is formed by an organic polymer or an inorganic material or a mixture thereof, or includes organic polymer layers and inorganic material layers alternately arranged.

The organic polymer includes one or more flexible polymer materials, such as acrylates, oligomers containing hydroxyl and amino groups, polyimides, polyethylene glycol phthalates, polycarbonates, polyesters (PET) and polydimethylsiloxanes (PDMS) and other materials. The thickness of the packaging layer 13 formed by the organic polymer may be in a range of 200 nm to 10000 nm.

The inorganic material may include oxides, nitrides, and/or carbides of one or more of silicon, aluminum, magnesium, zinc, tin, nickel and titanium. The thickness of the packaging layer 13 formed by the inorganic material may be in a range of 5 nm to 600 nm.

When the packaging layer 13 is composed of organic polymer layers and inorganic material layers alternately arranged, the inorganic material packaging layer 13 mainly functions as a tight package, and the organic polymer packaging layer 13 mainly functions as a flexible package to buffer the stress in the packaging layer 13. By the alternate arrangement of organic polymer layers and inorganic material layers, it is possible to take advantage of both the organic polymer layers and inorganic material layers and thus to increase the reliability of the packaging layer 13.

In this embodiment, the transition base 20 may be a rigid base, such as a base made of single crystal silicon, glass, or ceramic, or a base made of a rigid polymer material, or a base made of a composite material. Preferably, the thickness of the base is in a range of 100 µm to 500 µm.

Figure 5:
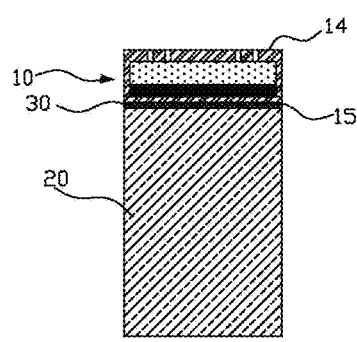
FIG. 5 is a schematic view of a transition device for a flexible device according to the third embodiment of the present disclosure.

The transition base 20 is bonded with the second surface 15 of the IC chip 10 by the adhesive layer 30. That is, when the IC chip 10 is applicable to a normal chip process, the transition base 20 is bonded with the surface of the IC chip 10 where the circuit functional layer 12 is located as shown in FIG. 1. When the IC chip 10 is applicable to a flip chip process, the transition base 20 is bonded with the surface of the IC chip 10 away from the circuit functional layer 12 as shown in FIG. 5. As shown in FIGS. 8a to 8d, the transition device can be directly applied to the mounting process of the IC chip 10 and directly mounted on the flexible base 40, and then the transition base 20 is removed to obtain a flexible device.

The adhesive layer 30 has a first adhesive surface 31 for bonding with the transition base 20 and a second adhesive surface 32 for bonding with the IC chip 10. In order to separate the adhesive layer 30 and the transition base 20 from the IC chip 10 after the IC chip 10 is mounted on the flexible base 40, the adhesive force between the first adhesive surface 31 and the transition base 20 is greater than that between the second adhesive surface 32 and the IC chip 10. Optionally, the adhesive force between the first adhesive surface 31 and the transition base 20 is greater than that between the second adhesive surface 32 and the IC chip 10 by applying modifying influence factors to the adhesive layer 30. The above modifying influence factors refer to influencing factors that can change the viscosity of the first adhesive surface 31 or the second adhesive surface 32, such as a specific temperature, light with a specific intensity or wavelength, etc.

Figure 2:
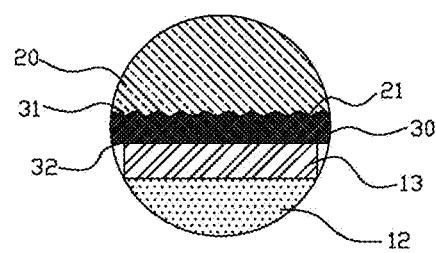
FIG. 2 is a schematic enlarged view of position A in FIG. 1.

In the first embodiment of the present disclosure, the above mentioned effects can be achieved by increasing the roughness of a surface of the transition base 20 in contact with the adhesive layer 30, and/or reducing the roughness of a surface of the packaging layer 13 in contact with the adhesive layer 30. As shown in FIG. 2, a plurality of concave-convex structures 21 for increasing the roughness are formed on the surface of the transition base 20 in contact with the adhesive layer 30 to increase the adhesive force between the transition base 20 and the adhesive layer 30. Preferably, the depth of a recess in the concave-convex structure 21 may be in a range of 1 µm to 15 µm, and the aspect ratio of the recess may be in a range of 0.5 to 3. When the concave-convex structures 21 have a zigzag shape, an angle at a top of a zigzag is in a range of 30° to 150°.

Figure 3:
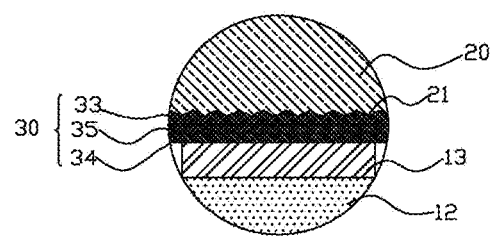
FIG. 3 is a schematic enlarged view of position A in a transition device for a flexible device according to a second embodiment of the present disclosure.

In other embodiments, as shown in FIG. 3, the adhesive layer 30 at least includes a first adhesive layer 33 in contact with the transition base 20 and a second adhesive layer 34 in contact with the IC chip 10, that is, the first adhesive surface 31 is formed between the first adhesive layer 33 and the transition base 20, and the second adhesive surface 32 is formed between the second adhesive layer 34 and the IC chip 10. By applying modifying influence factors, it is possible to increase the viscosity of the first adhesive layer 33 and/or reduce the viscosity of the second adhesive layer 34.

Based on the above mentioned effects, the first adhesive layer 33 may be formed by a heat sensitive adhesive, whose viscosity may be increased by application of a modifying temperature, and the first adhesive layer 33 may also be formed by an ultraviolet sensitive adhesive, whose viscosity may be increased by irradiating with modifying ultraviolet light. The second adhesive layer 34 may be formed by a heat sensitive adhesive, whose viscosity may be reduced by application of a modifying temperature, and the second adhesive layer 34 may also formed by an ultraviolet sensitive adhesive, whose viscosity may be reduced by irradiating with modifying ultraviolet light.

When the viscosity of the second adhesive layer 34 is reduced by applying modifying influence factors, the first adhesive layer 33 may also be a permanent adhesive, whose viscosity remains unchanged in applying modifying influence factors to the second adhesive layer 34.

As shown in FIG. 3, the adhesive layer 30 further includes a buffer layer 35 disposed between the first adhesive layer 33 and the second adhesive layer 34, and two surfaces of the buffer layer 35 are bonded with the first adhesive layer 33 and the second adhesive layer 34, respectively, such that the second adhesive layer 34 can be smoothly separated from the IC chip 10 in removing the transition base 20.

Further, the buffer layer 35 is made of a low thermal conductivity material with a thermal conductivity of less than 0.5, such as glass fiber, polyvinyl chloride (PVC), epoxy resin, etc., to prevent influences on one of the adhesive layers in applying modifying influence factors to the other adhesive layers.

Figure 7:
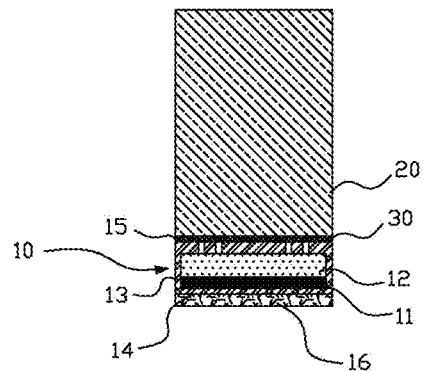
FIG. 7 is a schematic view of a transition device for a flexible device according to a fifth embodiment of the present disclosure.
Figure 8A:
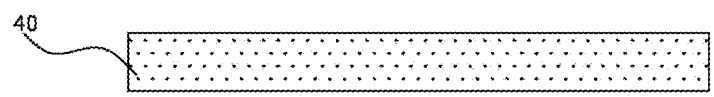
FIGS. 8a to 8d are schematic views of structures obtained in a method for producing a transition device for a flexible device according to a sixth embodiment of the present disclosure.
Figure 8B:
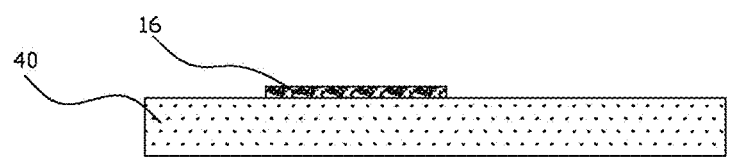
Figure 8C:
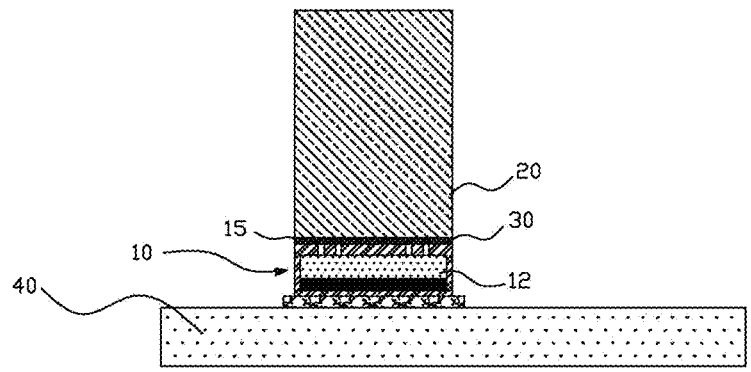
Figure 8D:
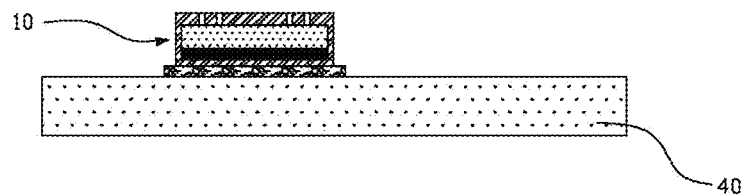

In order to facilitate subsequent mounting of the IC chip 10 by the transition device for the flexible device according to the present disclosure, as shown in FIG. 7, a chip bonding film 16 is disposed on the surface of the IC chip 10 away from the transition base 20, i.e. on the first surface 14 of the IC chip 10 for bonding with the flexible base 40. The chip bonding film 16 may be a die attach film (DAF). Thus, the transition device for the flexible device can be formed into an attachable device to further reduce the difficulty of mounting the IC chip 10 and of controlling the mounting process, such that mass commercial production of flexible devices can be advantageously performed at a low cost.

The viscosity of the chip bonding film 16 is greater than that of the adhesive layer 30, specifically, the first adhesive layer 33, such that the adhesive layer 30 can be peeled from the IC chip 10 in removing the transition base 20, and it is possible to make the bonding between the IC chip 10 and the flexible base 40 more stable.

An image microstructure is further formed on the surface of the IC chip 10 away from the transition base 20, i.e. the first surface 14 for bonding with the flexible base 40, by a laser lithographic printing process, for example. The image microstructure has a cruciform or circular shape, etc., to facilitate image recognition and alignment, position calibration, angular offset and other operations during the mounting of the flexible device in the subsequent process, and thus to improve the mounting accuracy for the device.

The transition device for the flexible device according to the present disclosure takes the transition base 20 as a substrate to directly perform the thinning of the IC chip substrate 11, after the second surface 15 of the IC chip 10 is bonded with the transition base 20, thereby facilitating the thinning process of the IC chip 10. Further, the transition device for the flexible device is compatible with the existing surface mounted technology (SMT). Alternatively, in the wafer feeding way for chip encapsulating, the transition device can be directly applied to the mounting process of the IC chip 10 to reduce the difficulty of mounting process control of an IC chip mounting equipment in mounting the IC chip 10, thereby facilitating the mounting of the IC chip 10. At the same time, since the packaging layer 13 is formed on the IC chip 10, the transition base 20 is bonded to the packaging layer 13 by the adhesive layer 30. On the one hand, since the packaging layer 13 is provided, it is possible to bond or peel the adhesive layer 30 to or from the IC chip 10 without damage to the IC chip substrate 11 and the circuit functional layer 12. On the other hand, during the movement of the transition device, the packaging layer 13 can protect the IC chip substrate 11 and the circuit functional layer 12 and buffer the stress therein, and prevent external dust, static electricity and the like from affecting the IC chip substrate 11 and the circuit functional layer 12, which reduces the difficulty of the storage, transportation and subsequent mounting processes of the IC chip 10. Finally, in the mounting process of the IC chip 10, since the IC chip substrate 11 and the circuit functional layer 12 are protected by the packaging layer 13, the requirements of the mounting process for the workshop environment and equipment accuracy can be reduced, such that the transition device for the flexible device can circulate in the mounting industry of the IC chip 10 as an independent product, which is conducive to the customized production of ultra-thin flexible devices by downstream manufacturers of the IC chip 10 and the development of the flexible device industry.

Figure 4A:
FIGS. 4a to 4g are schematic views of structures obtained in a method for producing a transition device for a flexible device according to a third embodiment of the present disclosure.
Figure 4B:
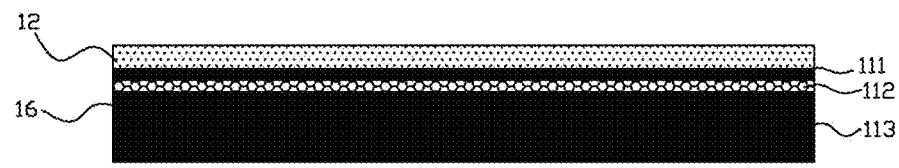
Figure 4C:
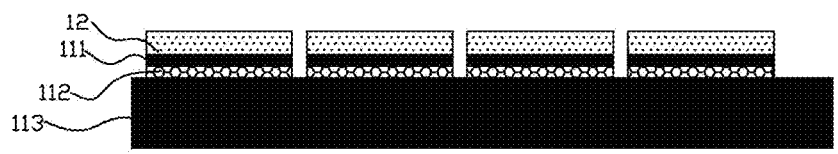
Figure 4D:
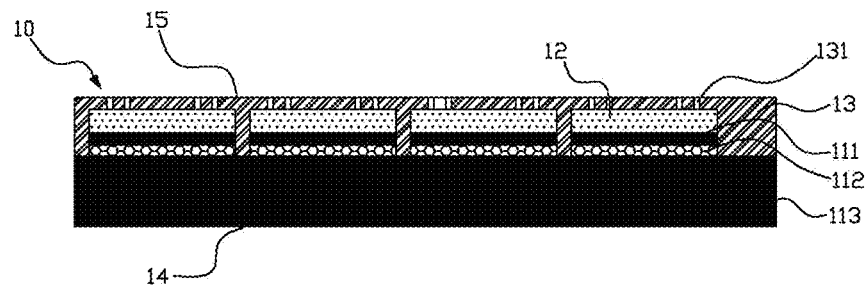
Figure 4E:
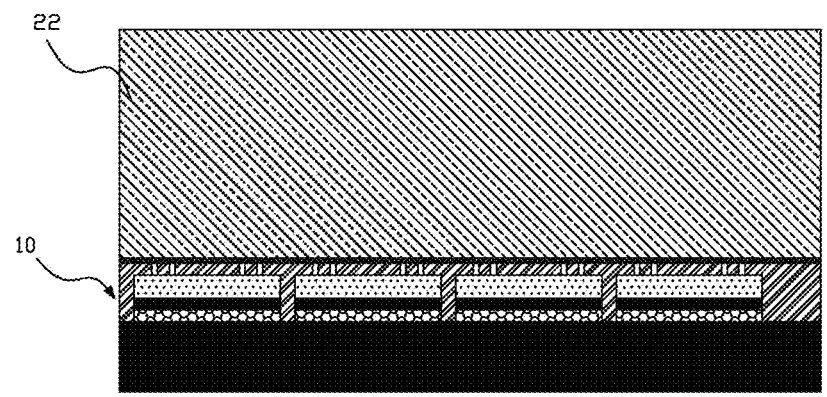
Figure 4F:
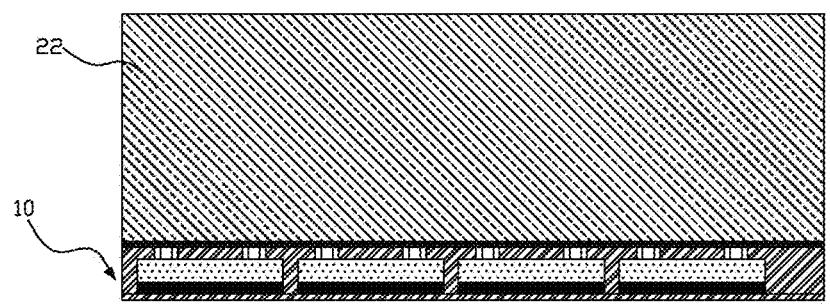
Figure 4G:
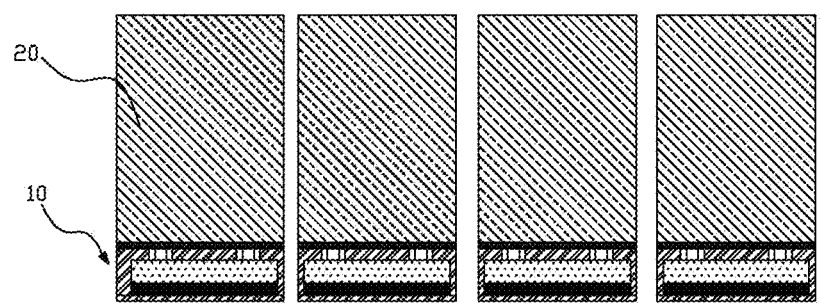

As shown in FIGS. 4a to 4g, the present disclosure further provides a method for producing the transition device for the flexible device. The method includes steps as follows:

a wafer 16 is provided, and a circuit functional layer 12 is formed on the wafer 16 as shown in FIG. 4a and FIG. 4b;

the wafer 16 and the circuit functional layer 12 are diced to form a plurality of IC chip substrates 11 on the wafer 16, and each IC chip substrate 11 is formed with a corresponding circuit functional layer 12 as shown in FIG. 4c;

the IC chip substrate 11 and the circuit functional layer 12 are encapsulated to become an IC chip 10, and a packaging layer 13 is formed on a surface of the IC chip 10 where the circuit functional layer 12 is located, and on a side of the IC chip 10 as shown in the FIG. 4d, in which the IC chip 10 has a first surface 14 for mounting with a base, such as a flexible base 40, and a second surface 15 opposite to the first surface 14;

a transition blank 22 is provided and bonded to the second surface 15 of the IC chip 10 by the adhesive layer 30 as shown in FIGS. 4e and 4g;

the transition blank 22 is diced to form a plurality of independent transition devices for the flexible device.

It should be noted that, in this embodiment, the transition blank 22 is diced to form individual transition bases 20.

Through the above mentioned method for producing the transition device for the flexible device, it is possible to produce the flexible device in mass commercial producing processes, and after the transition device for the above flexible device is produced, it is possible to encapsulate the transition device in a tape or tray for easy storage and transportation.

Further, in this method, when the circuit functional layer 12 is formed on the wafer 16, it is necessary to thicken a PAD of an I/O port of the circuit functional layer 12, and fabricate a flexible electrode on the PAD. The flexible electrode may include nanomaterials such as Au, Ag or C, or a viscous mixture formed by nanomaterials such as Au, Ag or C and polymers, such that the PAD of the circuit functional layer can be drawn from the packaging layer 13 in producing the packaging layer 13.

Further, in this embodiment, as shown in FIG. 4c, for example, when the substrate of the IC chip includes silicon on insulator (SOI), in dicing the wafer 16 and the circuit functional layer 12, the circuit functional layer 12, a top silicon layer 111 and a buried oxide layer 112 are diced sequentially. It will be understood that if the IC chip substrate 11 includes bulk silicon, in dicing the wafer 16 and the circuit functional layer 12, the circuit functional layer 12 and the silicon layer are diced sequentially. The depth of the dicing may be in a range of 20 μm to 150 μm.

In this embodiment, for example, the wafer 16 and the circuit functional layer 12 can be diced by etching, mechanical cutting, or laser cutting.

The packaging layer 13 may be formed by an organic polymer or an inorganic material or a mixture thereof, or includes organic polymer layers and inorganic material layers alternately arranged.

The organic polymer includes one or more flexible polymer materials, such as acrylates, oligomers containing hydroxyl and amino groups, polyimides, polyethylene glycol phthalates, polycarbonates, polyesters (PET) and polydimethylsiloxanes (PDMS) and other materials. The thickness of the packaging layer 13 formed by the organic polymer may be in a range of 200 nm to 10000 nm.

The inorganic material may include oxides, nitrides, and/or carbides of one or more of silicon, aluminum, magnesium, zinc, tin, nickel and titanium. The thickness of the packaging layer 13 formed by the inorganic material may be in a range of 5 nm to 600 nm.

The adhesive layer 30 has a first adhesive surface 31 for bonding with the transition blank 22 and a second adhesive surface 32 for bonding with the IC chip 10. In order to separate the adhesive layer 30 and the transition blank 22 from the IC chip 10 after the IC chip 10 is mounted on the transition blank 22, the adhesive force between the first adhesive surface 31 and the transition blank 22 is greater than that between the second adhesive surface 32 and the IC chip 10 by or without applying modifying influence factors to the adhesive layer 30.

In other embodiment, the above mentioned effects can be achieved by increasing the adhesive area of a surface of the transition blank 22 in contact with the adhesive layer 30, and/or reducing the adhesive area of a surface of the packaging layer 13 in contact with the adhesive layer 30. As shown in FIG. 2, a plurality of concave-convex structures 21 for increasing the adhesive area are formed on the surface of the transition blank 22 in contact with the adhesive layer 30 to increase the adhesive force between the transition blank 22 and the adhesive layer 30. Preferably, the depth of a recess in the concave-convex structure 21 may be in a range of 1 μm to 15 μm, and the aspect ratio of the recess structure may be in a range of 0.5 to 3. When the concave-convex structures 21 have a zigzag shape, an angle at a top of a zigzag is in a range of 30° to 150°.

In other embodiments, as shown in FIG. 3, the adhesive layer 30 includes at least a first adhesive layer 33 in contact with the transition blank 22 and a second adhesive layer 34 in contact with the packaging layer 13, that is, the first adhesive surface 31 is formed between the first adhesive layer 33 and the transition blank 22, and the second adhesive surface 32 is formed between the second adhesive layer 34 and the packaging layer 13. By applying the modifying influence factors, the viscosity of the first adhesive layer 33 can be increased, and/or the viscosity of the second adhesive layer 34 can be reduced.

Based on the above mentioned effects, the first adhesive layer 33 may include a heat sensitive adhesive, whose viscosity may be increased by applying a modifying temperature, and the first adhesive layer 33 may also include an ultraviolet sensitive adhesive, whose viscosity may be increased by irradiating with modifying ultraviolet light. The second adhesive layer 34 may include a heat sensitive adhesive, whose viscosity may be reduced by applying a modifying temperature, and the second adhesive layer 34 may also include an ultraviolet sensitive adhesive, whose viscosity may be reduced by irradiating with modifying ultraviolet light.

When the viscosity of the second adhesive layer 34 is reduced by applying modifying influence factors, the first adhesive layer 33 may also be a permanent adhesive, whose viscosity remains unchanged in applying modifying influence factors to the second adhesive layer 34.

Further, in this method, the adhesive layer 30 further includes a buffer layer 35 disposed between the first adhesive layer 33 and the second adhesive layer 34, and two surfaces of the buffer layer 35 are bonded with the first adhesive layer 33 and the second adhesive layer 34, respectively, such that the second adhesive layer 34 can be smoothly separated from the IC chip 10 in removing the transition blank 22.

Further, the buffer layer 35 is made of a low thermal conductivity material with a thermal conductivity of less than 0.5, such as glass fiber, polyvinyl chloride (PVC), epoxy resin, etc., to prevent influences on one of the adhesive layers 30 in applying modifying influence factors to the other adhesive layer 30.

In this method, after forming the packaging layer 13, the IC chip substrate 11 may be thinned. In this embodiment, the IC chip substrate 11 can be thinned by mechanical grinding, etching, or other methods.

In this embodiment, when the IC chip 10 is applicable to a normal chip process, the second surface 15 of the IC chip 10 is the surface where the circuit functional layer 12 is located. In bonding the transition blank 22, the transition blank 22 is directly bonded to the surface where the circuit functional layer 12 of the IC chip 10 is located, and the surface of the IC chip substrate 11 to be thinned will be directly exposed, that is, the first surface. The IC chip substrate 11 is thinned to reduce the thickness thereof to less than 80 μm. When the IC chip substrate 11 includes silicon on insulator (SOI), the silicon substrate 113 and the buried oxide layer 112 are directly removed to only retain the top silicon layer 111. In thinning the IC chip substrate 11, the transition blank 22 may be directly used as a substrate, which can reduce the number of times of transferring the IC chip substrate 11 and thus reduce damage to the IC chip 10 when the silicon substrate 113 is thinned based on this method. At the same time, since a packaging layer 13 is formed on the surface where the circuit functional layer 12 of the IC chip 10 is located and on a side of the IC chip 10 when the IC chip 11 is thinned, the packaging layer 13 can protect the IC chip substrate 11 to further reduce the damage to the IC chip substrate 11 during the thinning process, and at the same time reduce the requirements of the thinning process on the equipment and the environment, thereby reducing the cost.

Further, after the thinning process, the method further includes encapsulating the surface where the IC chip 10 is thinned, such that the packaging layer 13 can completely wrap the IC chip substrate 11 and the circuit functional layer 12.

Figure 6A:
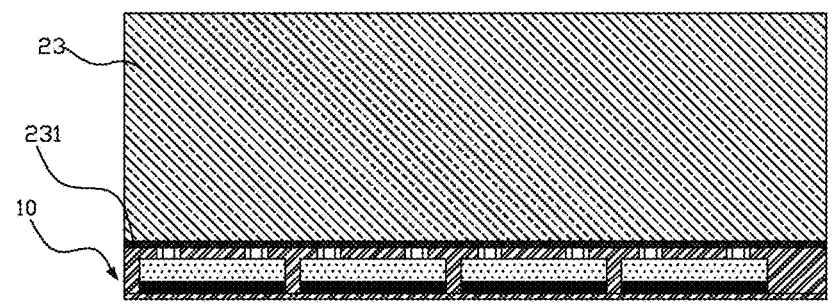
FIGS. 6a to 6c are schematic views of structures obtained in a method for producing a transition device for a flexible device according to a fourth embodiment of the present disclosure.
Figure 6B:
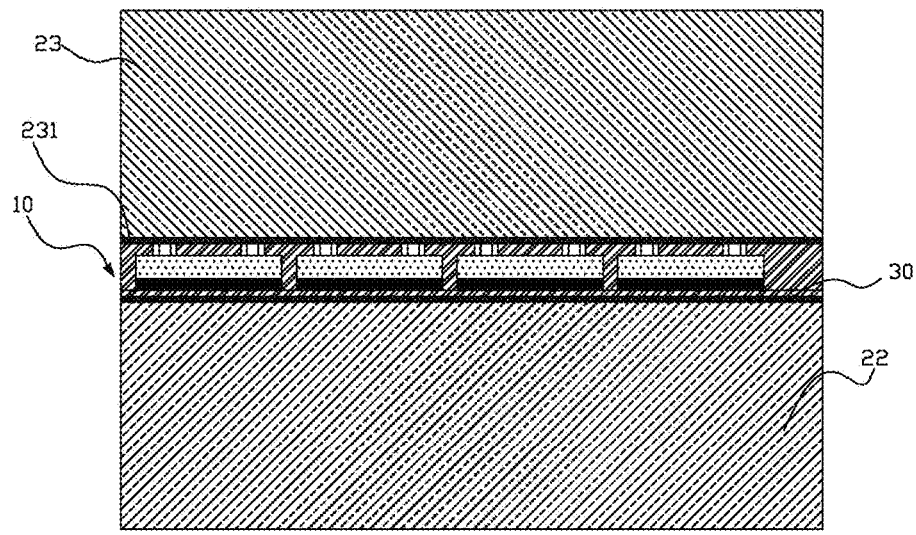
Figure 6C:
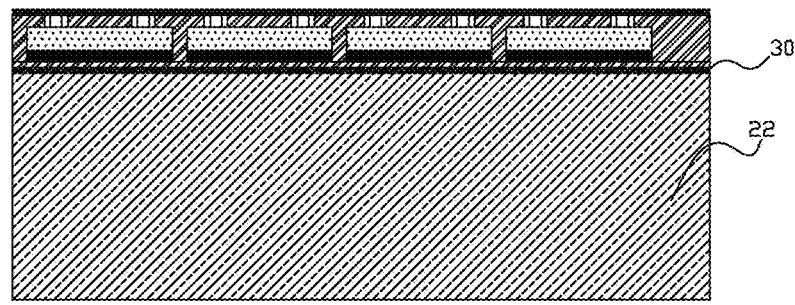

When the IC chip 10 is applicable to the flip chip process, the first surface 14 of the IC chip 10 is the surface where the circuit functional layer 12 is located, and the transition blank 22 is bonded with the surface of the IC chip substrate 11 away from the circuit functional layer 12 as shown in FIG. 5. As shown in FIGS. 6a to 6c, after the packaging layer 13 is formed, the method further includes providing an adapter plate 23 for the thinning process. The adapter plate 23 is bonded with the first surface 14 of the IC chip 10 applicable to the flip chip process by an adapter adhesive layer 231, that is, the adapter plate 23 is bonded with the surface of the IC chip 10 where the circuit functional layer 12 is located. Then, the IC chip substrate 11 is thinned to reduce the thickness thereof to less than 80 μm. When the IC chip substrate 11 includes silicon on insulator (SOI), the silicon substrate 113 and the buried oxide layer 112 are directly removed to only retain the top silicon layer 111. After the thinning process, the thinned surface of the IC chip substrate 11 can be encapsulated, such that the packaging layer 13 encapsulates the IC chip substrate 11 and the circuit functional layer 12 from each surface of the IC chip 10. Then, the transition blank 22 is bonded with the thinned surface of the IC chip 10 by the adhesive layer 30, and finally the adapter plate 23 and the adapter adhesive layer 231 are peeled and the transition device for the flexible device is formed by cutting the transition blank 22.

In order to ensure the adapter plate 23 and the adapter adhesive layer 231 to be smoothly separated from the IC chip 10, in this embodiment, the adhesive force between the adapter adhesive layer 231 and the IC chip 10 is smaller than that between the adhesive layer 30 and the IC chip 10.

Further, after the thinning process, for example, the method further includes eliminating residual stress of the thinned surface of the IC chip substrate 11 by a dry etching or dry polishing process.

In order to further simplify the subsequent mounting process of the IC chip 10, in this embodiment, the method further includes forming a chip bonding film 16 on the first surface 14 of the IC chip 10. The chip bonding film 16 may be a die attach film (DAF). The viscosity of the chip bonding film 16 is greater than that of the adhesive layer 33, specifically, the first adhesive layer 33, such that the IC chip 10 can be peeled from the transition base 20 in removing the transition base 20, and it is possible to make the bonding between the IC chip 10 and the flexible base 40 more stable.

Further, the method further includes forming an image microstructure on the transition blank 22, and the image microstructure is located on a surface of the transition blank 22 away from the IC chip 10.

The present disclosure further provides a method for mounting a flexible device based on the transition device for the flexible device as described above. As shown in FIGS. 8a to 8d, the method includes the following steps:

providing a flexible base 40 and the transition device for the flexible device as described above;

mounting the IC chip 10 in the transition device to the flexible base 40; and removing the transition base 20 and the adhesive layer 30 from the IC chip 10.

In the above mentioned mounting method, by using the transition device for the flexible device according to embodiments of the present disclosure, a packaging layer 13 is formed outside the IC chip substrate 11 and the circuit functional layer 12, and a transition base 20 is bonded on the second surface 15 of the IC chip 10. Thus, the packaging layer 13 has flexibility to relieve stress, and in the mounting process, the transition base 20 can be grasped to move the IC chip substrate 11, which can reduce the requirements for the equipment accuracy and the workshop environment.

Further, in this embodiment, in order to facilitate the mounting of the IC chip 10, a chip bonding film 16 is provided on the flexible base 40 and/or a surface of the IC chip 10 for mounting with the flexible base 40. The chip bonding film 16 may be a die attach film (DAF), and the viscosity of the chip bonding film 16 is greater than that of the first adhesive layer 33, such that the IC chip 10 can be peeled from the transition base 20 in removing the transition base 20, and it is possible to make the bonding between the IC chip 10 and the flexible base 40 more stable.

Further, in removing the transition base 20 and the adhesive layer 30, the method further includes applying influencing factors such as a temperature or ultraviolet light to the adhesive layer 30 to reduce the adhesive force between the IC chips 10 and the adhesion layer 30, and/or increase the adhesive force between the adhesive layer 30 and the transition base 20, such that the transition base 20 and the adhesive layer 30 can be removed from the IC chip 10.

Figure 9:
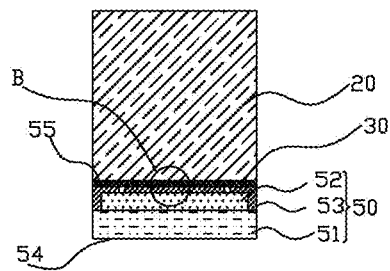
FIG. 9 is a schematic view of a transition device for a flexible device according to a seventh embodiment of the present disclosure.

As shown in FIG. 9, a transition device for a flexible device according to a seventh embodiment of the present disclosure includes a flexible component 50 based on a polymer substrate and a transition base 20, and the transition base 20 is bonded with the flexible component 50 based on the polymer substrate by an adhesive layer 30.

In the present disclosure, the flexible component 50 based on the polymer substrate can be a functional component based on the polymer substrate, such as a resistor, a capacitor, a sensor, a bio-MEMS (biological micro-electro-mechanical system), etc. The flexible component 50 based on the polymer substrate includes a substrate layer 51, a device functional layer 52 on the substrate layer 51 and a packaging layer 53, in which the packaging layer 53 at least encapsulates the device functional layer 52.

The packaging layer 53 is formed by an organic polymer or an inorganic material, or includes organic polymer layers and inorganic material layers alternately arranged.

The organic polymer includes one or more flexible polymer materials, such as acrylates, oligomers containing hydroxyl and amino groups, polyimides, polyethylene glycol phthalates, polycarbonates, polyesters (PET) and polydimethylsiloxanes (PDMS) and other materials. The thickness of the packaging layer 53 formed by the organic polymer may be in a range of 200 nm to 10000 nm.

The inorganic material may include oxides, nitrides, and/or carbides of one or more of silicon, aluminum, magnesium, zinc, tin, nickel and titanium. The thickness of the packaging layer 53 formed by the inorganic material may be in a range of 5 nm to 600 nm.

The substrate layer 51 is an organic polymer layer, or includes organic polymer layers and inorganic material layers alternately arranged.

The organic polymer includes one or more flexible polymer materials, such as acrylates, oligomers containing hydroxyl and amino groups, polyimides, polyethylene glycol phthalates, polycarbonates, polyesters (PET) and polydimethylsiloxanes (PDMS) and other materials. The inorganic material may include oxides, nitrides, and/or carbides of one or more of silicon, aluminum, magnesium, zinc, tin, nickel and titanium.

In the above mentioned structure, when the packaging layer 53 is composed of organic polymer layers and inorganic material layers alternately arranged, the inorganic material packaging layer 53 mainly functions as a hermetical package, and the organic polymer packaging layer 53 mainly functions as a flexible package to buffer the stress in the packaging layer 53. By the alternate arrangement of organic polymer layers and inorganic material layers, it is possible to take advantage of both the organic polymer layers and inorganic material layers and thus to increase the reliability of the packaging layer 53.

The flexible component 50 based on the polymer substrate has a first surface 54 for mounting with a base, such as a flexible base 40, and a second surface 55 opposite to the first surface 54. In a normal chip process, i.e. in the mounting process where the PAD of the device functional layer 52 faces away from the base after the flexible component 50 based on the polymer substrate is mounted on the base (as shown in FIG. 9, and FIGS. 12*a* to 12*d*), when the flexible component 50 based on the polymer substrate is mounted on the base, the device functional layer 52 of the flexible component 50 based on the polymer substrate is located further away from the base than the substrate layer 51. At this time, a surface of the flexible component 50 based on the polymer substrate where the device functional layer 52 is located is taken as the second surface 55 of the flexible component 50 based on the polymer substrate, and a surface of the flexible component 50 where the substrate layer 51 is located is taken as the first surface 54 of the flexible component 50 based on the polymer substrate. In a flip chip process (as shown in FIG. 13, and FIGS. 15*a* to 15*c*), i.e. in the mounting process where the PAD of the device functional layer 52 faces towards the base after the flexible component 50 based on the polymer substrate is mounted on the base, when the flexible component 50 based on the polymer substrate is mounted on the base, the device functional layer 52 of the flexible component 50 based on the polymer substrate is located nearer to the base than the substrate layer 51. At this time, a surface of the flexible component 50 based on the polymer substrate where the device functional layer 52 is located is taken as the first surface 54 of the flexible component 50 based on the polymer substrate, and a surface of the flexible component 50 where the substrate layer 51 is located is taken as the second surface 55 of the flexible component 50 based on the polymer substrate.

Figure 13:
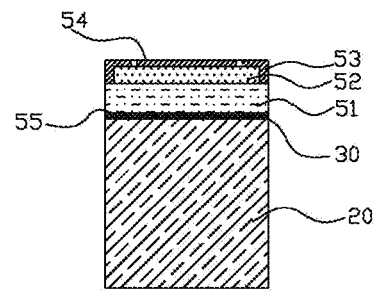
FIG. 13 is a schematic view of a transition device for a flexible device according to a tenth embodiment of the present disclosure.

The transition base 20 is bonded with the second surface 55 of the flexible component 50 based on the polymer substrate by the adhesive layer 30, that is, when the flexible component 50 based on the polymer substrate is applicable to a normal chip process, the transition base 20 is bonded with the surface of the flexible component 50 based on the polymer substrate where the device functional layer 52 is located as shown in FIG. 9. When the flexible component 50 based on the polymer substrate is applicable to a flip chip process, the transition base 20 is bonded with the surface of the flexible component 50 based on the polymer substrate where the substrate layer 51 is located as shown in FIG. 13.

In this embodiment, the transition base 20 may be a rigid base, such as a base made of single crystal silicon, glass, ceramic, a rigid polymer material, or a composite material. Preferably, the thickness of the base is in a range of 100 μm to 500 μm.

As shown in FIGS. 16*a* to 16*d*, the transition device according to embodiments of the present disclosure can be directly used to mount the flexible component 50 based on the polymer substrate on the flexible base 40. Then, the transition base 20 is peeled to obtain a flexible device.

The adhesive layer 30 has a first adhesive surface 31 for bonding with the transition base 20 and a second adhesive surface 32 for bonding with the flexible component 50 based on the polymer substrate. After the flexible component 50 based on the polymer substrate is mounted on the flexible base 40, in order to separate the adhesive layer 30 and the transition base 20 from the flexible component 50 based on the polymer substrate, the adhesive force between the first adhesive surface 31 and the transition base 20 is greater than that between the second adhesive surface 32 and the flexible component 50 based on the polymer substrate by or without applying modifying influence factors to the adhesive layer 30. The above modifying influence factors refer to influencing factors that can change the viscosity of the first adhesive surface 31 or the second adhesive surface 32, such as a specific temperature, light with a specific intensity or wavelength, etc.

Figure 10:
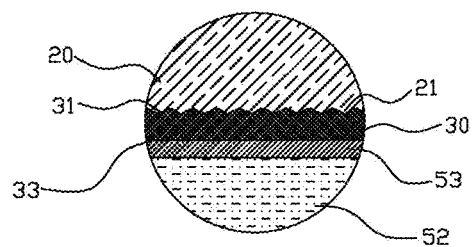
FIG. 10 is a schematic enlarged view of position B in FIG. 9.

In the first embodiment of the present disclosure, the above mentioned effects can be achieved by increasing the adhesive area of a surface of the transition base 20 in contact with the adhesive layer 30, and/or reducing the adhesive area of a surface of the packaging layer 53 in contact with the adhesive layer 30. As shown in FIG. 10, a plurality of concave-convex structures 21 for increasing the adhesive area are formed on the surface of the transition base 20 in contact with the adhesive layer 30 to increase the adhesive force between the transition base 20 and the adhesive layer 30. Preferably, a recess in the concave-convex structure 21 may have a depth in a range of 1 µm to 15 µm, and an aspect ratio in a range of 0.5 to 3. When the concave-convex structures 21 have a zigzag shape, an angle at a top of a zigzag is in a range of 30° to 150°.

Figure 11:
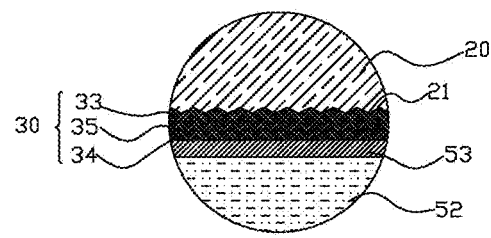
FIG. 11 is a schematic enlarged view of position B in a transition device for a flexible device according to an eighth embodiment of the present disclosure.

In other embodiments, as shown in FIG. 11, the adhesive layer 30 at least includes a first adhesive layer 33 in contact with the transition base 20 and a second adhesive layer 34 in contact with the flexible component 50 based on the polymer substrate, that is, the first adhesive surface 31 is formed between the first adhesive layer 33 and the transition base 20, and the second adhesive surface 32 is formed between the second adhesive layer 34 and the flexible component 50 based on the polymer substrate. By applying the modifying influence factors, the viscosity of the first adhesive layer 33 can be increased, and/or the viscosity of the second adhesive layer 34 can be reduced.

Based on the above mentioned effect, the first adhesive layer 33 may be formed by a heat sensitive adhesive, where the viscosity of the first adhesive layer 33 is increased by applying a modifying temperature, and the first adhesive layer 33 may also be formed by an ultraviolet sensitive adhesive, where the viscosity of the first adhesive layer 33 may be increased by irradiating with modifying ultraviolet light. The second adhesive layer 34 may be formed by a heat sensitive adhesive, where the viscosity of the second adhesive layer 34 may be reduced by applying a modifying temperature, and the second adhesive layer 34 may also be formed by an ultraviolet sensitive adhesive, where the viscosity of the second adhesive layer 34 may be reduced by irradiating with modifying ultraviolet light.

When the viscosity of the second adhesive layer 34 is reduced by applying modifying influence factors, the first adhesive layer 33 may also include a permanent adhesive, whose viscosity remains unchanged in applying modifying influence factors to the second adhesive layer 34.

As shown in FIG. 11, the adhesive layer 30 further includes a buffer layer 35 disposed between the first adhesive layer 33 and the second adhesive layer 34, and two surfaces of the buffer layer 35 are bonded with the first adhesive layer 33 and the second adhesive layer 34, respectively, such that the second adhesive layer 34 can be smoothly separated from the flexible component 50 based on the polymer substrate in removing the transition base 20.

Further, the buffer layer 35 is made of a low thermal conductivity material with a thermal conductivity of less than 0.5, such as glass fiber, polyvinyl chloride (PVC), epoxy resin, etc., to prevent influences on one of the adhesive layers 30 in applying modifying influence factors to the other adhesive layers 30.

Figure 14:
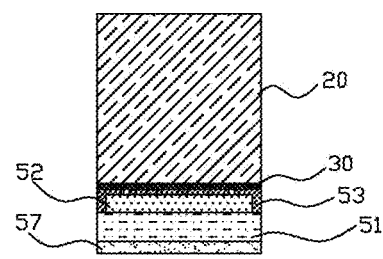
FIG. 14 is a schematic view of a transition device for a flexible device according to an eleventh embodiment of the present disclosure.
Figure 15A:
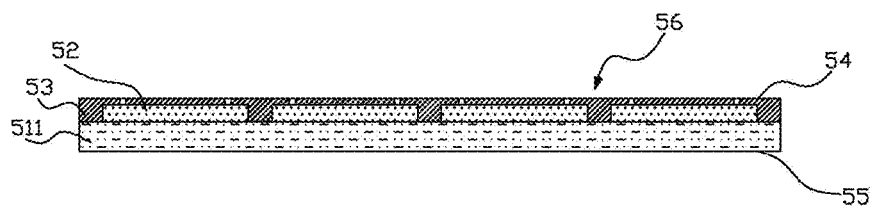
FIGS. 15a to 15c are schematic views of structures obtained in a method for producing a transition device for a flexible device according to a twelfth embodiment of the present disclosure.
Figure 15B:
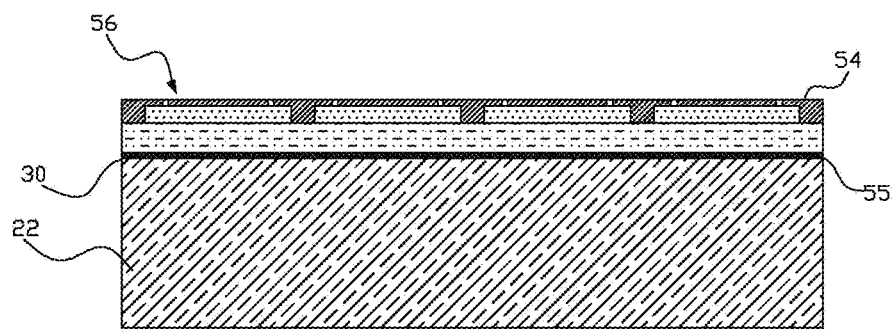
Figure 15C:
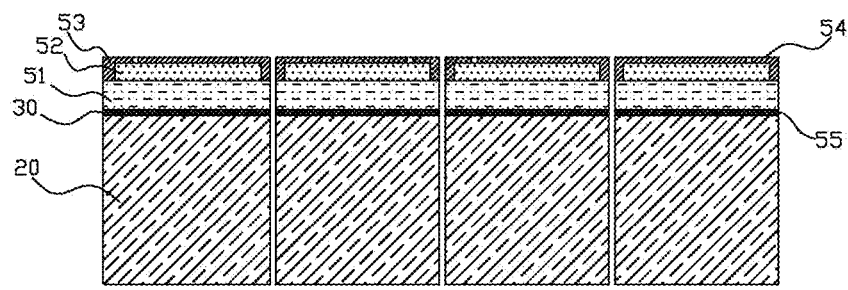
Figure 16A:
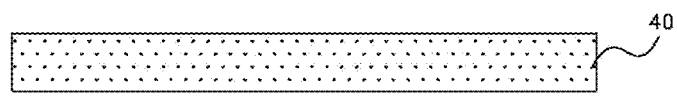
FIGS. 16a to 16d are schematic views of structures obtained in a method for mounting a flexible device using a transition device for a flexible device according to a thirteenth embodiment of the present disclosure.
Figure 16B:
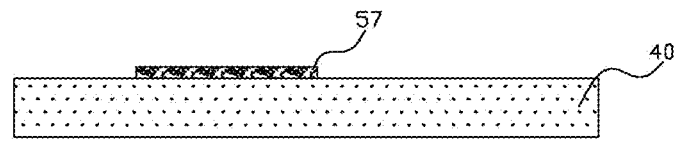
Figure 16C:
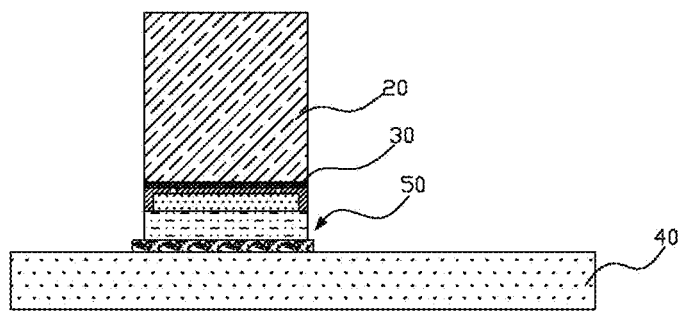
Figure 16D:
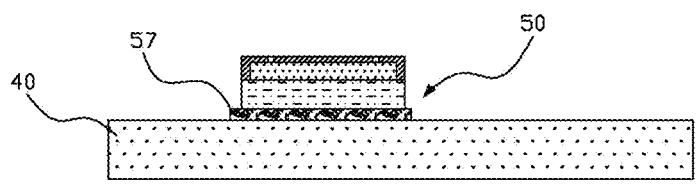
Figure 17A:
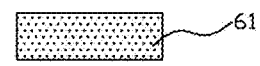
FIGS. 17a to 17f are schematic views of structures obtained in a method for fabricating a flexible device according to a fourteenth embodiment of the present disclosure.
Figure 17B:
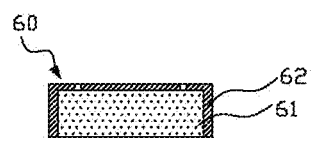
Figure 17C:
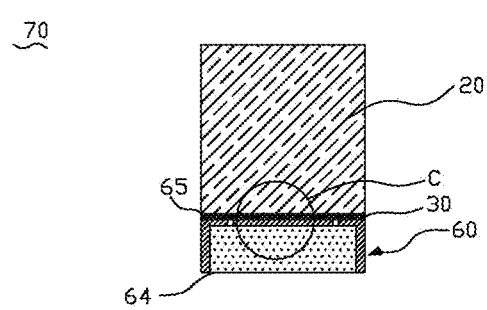
Figure 17D:
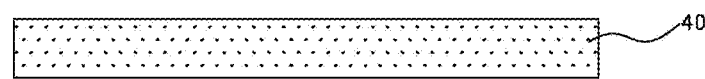
Figure 17E:
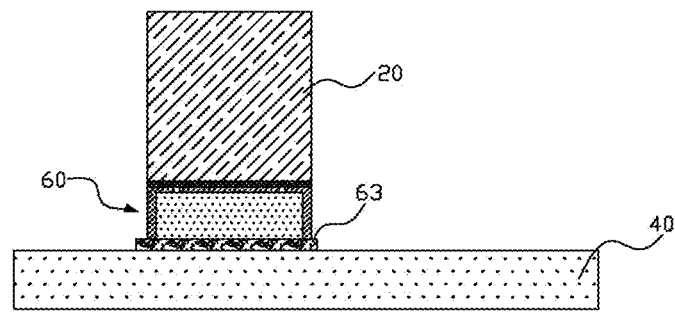
Figure 17F:
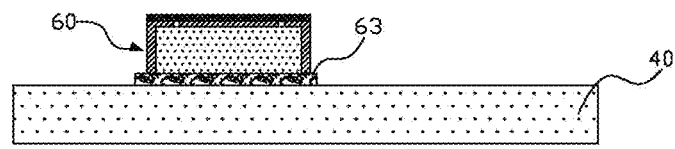

In order to facilitate subsequent mounting of the flexible component 50 based on the polymer substrate by the transition device for the flexible device according to the present disclosure, as shown in FIG. 14, a device bonding film 57 is disposed on a surface of the flexible component 50 based on the polymer substrate away from the transition base 20, i.e. the first surface 54 of the flexible component 50 for mounting with the flexible base 40. The device bonding film 57 may be a die attach film (DAF). Thus, the transition device for the flexible device can be formed into an attachable device to further reduce the difficulty of mounting the flexible component 50 based on the polymer substrate and of controlling the mounting process, such that mass commercial production of flexible devices can be advantageously performed at a low cost.

The viscosity of the device bonding film 57 is greater than that of the adhesive layer 30, specifically, the viscosity of the first adhesive layer 33, such that the adhesive layer 30 can be peeled from the flexible component 50 based on the polymer substrate in removing the transition base 20, and it is possible to make the bonding between the flexible component 50 based on the polymer substrate and the flexible base 40 more stable.

An image microstructure (not shown) is further formed on a surface of the flexible component 50 based on the polymer substrate away from the transition base 20 by a laser lithographic printing process, for example. The image microstructure has a cross or circular shape, etc., to facilitate image recognition and alignment, position calibration, angular offset and other operations during the mounting of the flexible device in the subsequent process, and thus to improve the mounting accuracy for the device.

With the transition device for the flexible device according to embodiments of the present disclosure, by bonding the second surface 55 of the flexible component 50 based on the polymer substrate with the transition base 20, in fixing the flexible component 50 based on the polymer substrate to the flexible base 40, the transition base 20 can be grasped to move the transition device, and then the flexible component 50 based on the polymer substrate can be fixed on the flexible base 40 by the mounting process, which can be compatible with the existing SMT technology. Alternatively, in the wafer feeding way for chip encapsulating, the flexible component 50 based on the polymer substrate can be fixed on the flexible base 40 by the mounting process like an IC chip, and thus it is possible to mount the flexible component 50 by the same equipment as the IC chip. Further, since the transition base 20 is provided, it is possible to reduce requirements for the accuracy of a grasping device. Further, since the packaging layer 53 is formed on the device functional layer 52 in the flexible component 50 based on the polymer substrate, on the one hand, it is possible to bond or peel the adhesive layer 30 to or from the flexible component 50 without damage to the device functional layer 52, on the other hand, during the movement of the transition device and in the mounting process, the packaging layer 53 can protect the flexible component 50 based on the polymer substrate and buffer the stress therein, and prevent external dust, static electricity, impact or the like from damaging the device functional layer 52, which reduces the difficulty of the storage, transportation and subsequent mounting processes of the flexible component 50 based on the polymer substrate. Further, in the mounting process of the flexible component 50 based on the polymer substrate, since the device functional layer 52 is protected by the packaging layer 53, the requirements of the mounting process for the workshop environment and equipment accuracy can be reduced, such that the transition device for the flexible device can circulate in the mounting industry of flexible electronic devices as an independent product, which is conducive to the customized production of ultra-thin electronic devices by downstream manufacturers and the development of the flexible device industry.

Figure 12A:
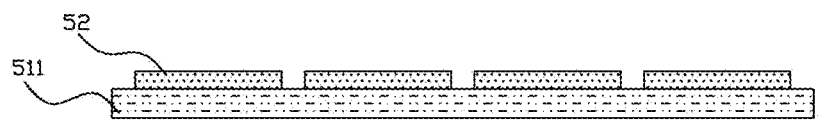
FIGS. 12a to 12d are schematic views of structures obtained in a method for producing a transition device for a flexible device according to a ninth embodiment of the present disclosure.
Figure 12B:
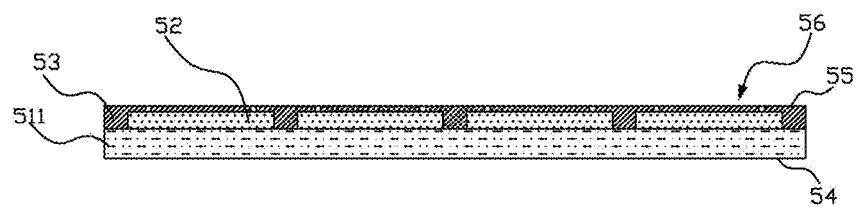
Figure 12C:
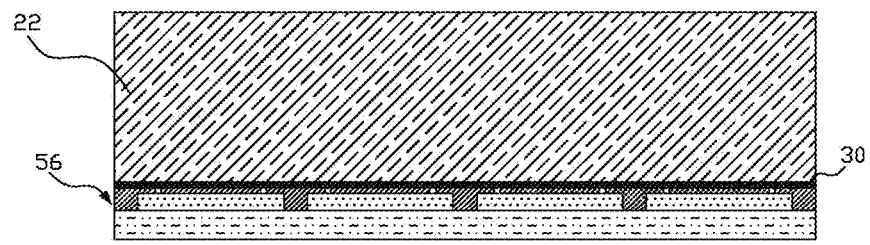
Figure 12D:
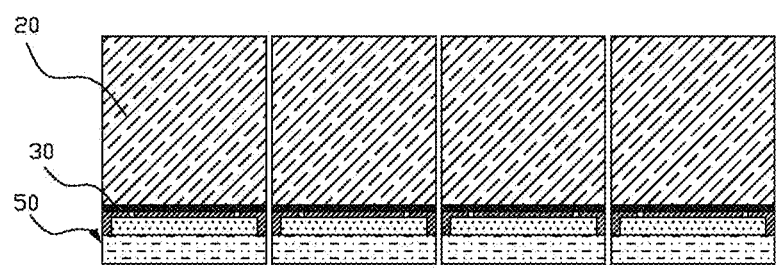

As shown in FIGS. 12a to 4d and FIGS. 15a to 15c, the present disclosure further provides a method for producing the transition device for the flexible device. The method includes steps as follows:

a substrate blank 511 is provided and a plurality of device functional layers 52 is formed on the substrate blank 511 as shown in FIG. 12a;

the device functional layer 52 is encapsulated to form a flexible component blank 56 based on the polymer substrate as shown in FIG. 12b, in which the flexible component blank 56 based on the polymer substrate has a first surface 54 for mounting with a base and a second surface 55 opposite to the first surface 54;

a transition blank 22 is provided and bonded to the second surface 55 of a flexible component blank 56 based on the polymer substrate by the adhesive layer 30 as shown in FIG. 12c;

the flexible component blank 56 based on the polymer substrate is diced to form a plurality of independent transition devices for the flexible device as shown in FIG. 12d.

Through the above mentioned method for producing the transition device for the flexible device, it is possible to produce the transition device for the above flexible device in mass commercial producing processes, and after the transition device for the above flexible devices is produced, it is possible to package the transition device in a tape or tray for easy storage and transportation as an independent product.

Further, in this method, in fabricating the device functional layer 52, it also includes thickening a PAD of the device functional layer 52 and fabricating a flexible electrode on the PAD of the device functional layer 52. The flexible electrode can include nanomaterials such as Au, Ag or C, or a viscous mixture formed by nanomaterials such as Au, Ag or C and polymers, such that the PAD of the device functional layer 52 can be drawn from the packaging layer 53 when the device functional layer 52 is encapsulated.

Further, in this embodiment, the packaging layer 53 is formed by an organic polymer or an inorganic material, or includes organic polymer layers and inorganic material layers alternately arranged.

The organic polymer includes one or more flexible polymer materials, such as acrylates, oligomers containing hydroxyl and amino groups, polyimides, polyethylene glycol phthalates, polycarbonates, polyesters (PET) and polydimethylsiloxanes (PDMS) and other materials. The thickness of the packaging layer 53 formed by the organic polymer may be in a range of 200 nm to 10000 nm.

The inorganic material may include oxides, nitrides, and/or carbides of one or more of silicon, aluminum, magnesium, zinc, tin, nickel and titanium. The thickness of the packaging layer 53 formed by the inorganic material may be in a range of 5 nm to 600 nm.

In this embodiment, the transition blank 22 may be a rigid base, such as a base made of single crystal silicon, glass, ceramic, a rigid polymer material, or a composite material. Preferably, the thickness of the transition blank 22 is in a range of 100 μm to 500 μm. The transition blank 22 forms a plurality of independent transition bases 20 by dicing.

In the method for producing the transition device for the flexible device according to the present disclosure, the adhesive layer 30 has a first adhesive surface 31 for bonding with the transition blank 22 and a second adhesive surface 32 for bonding with the flexible component 50 based on the polymer substrate. After the flexible component 50 based on the polymer substrate is mounted on the flexible base 40, in order to separate the adhesive layer 30 and the transition base 20 from the flexible component 50 based on the polymer substrate, the adhesive force between the first adhesive surface 31 and the transition blank 22 is greater than that between the second adhesive surface 32 and the flexible component 50 based on the polymer substrate by/without applying modifying influence factors to the adhesive layer 30.

In the first embodiment of the present disclosure, the above mentioned effects can be achieved by increasing the adhesive area of a surface of the transition blank 22 in contact with the adhesive layer 30, and/or reducing the adhesive area of a surface of the packaging layer 53 in contact with the adhesive layer 30. As shown in FIG. 10, a plurality of concave-convex structures 21 for increasing the adhesive area are formed on the surface of the transition blank 22 in contact with the adhesive layer 30 to increase the adhesive force between the transition blank 22 and the adhesive layer 30. Preferably, a recess in the concave-convex structure 21 may have a depth in a range of 1 μm to 15 μm, and an aspect ratio in a range of 0.5 to 3. When the concave-convex structures 21 have a zigzag shape, an angle at a top of a zigzag is in a range of 30° to 150°.

In other embodiments, as shown in FIG. 11, the adhesive layer 30 at least includes a first adhesive layer 33 in contact with the transition blank 22 and a second adhesive layer 34 in contact with the flexible component 50 based on the polymer substrate, that is, the first adhesive surface 31 is formed between the first adhesive layer 33 and the transition blank 22, and the second adhesive surface 32 is formed between the second adhesive layer 34 and the flexible component 50 based on the polymer substrate. By applying the modifying influence factors, the viscosity of the first adhesive layer 33 can be increased, and/or the viscosity of the second adhesive layer 34 can be reduced.

Based on the above mentioned effects, the first adhesive layer 33 may be formed by a heat sensitive adhesive, where the viscosity of the first adhesive layer 33 may be increased by applying a modifying temperature, and the first adhesive layer 33 may also be formed by an ultraviolet sensitive adhesive, where the viscosity of the first adhesive layer 33 may be increased by irradiating with modifying ultraviolet light. The second adhesive layer 34 may be formed by a heat sensitive adhesive, where the viscosity of the second adhesive layer 34 may be reduced by applying a modifying temperature, and the second adhesive layer 34 may also be formed by an ultraviolet sensitive adhesive, where the viscosity of the second adhesive layer 34 may be reduced by irradiating with modifying ultraviolet light.

When the viscosity of the second adhesive layer 34 is reduced by applying modifying influence factors, the first adhesive layer 33 may also be a permanent adhesive, whose viscosity remains unchanged in applying modifying influence factors to the second adhesive layer 34.

As shown in FIG. 11, the adhesive layer 30 further includes a buffer layer 35 disposed between the first adhesive layer 33 and the second adhesive layer 34, and two surfaces of the buffer layer 35 are bonded with the first adhesive layer 33 and the second adhesive layer 34, respectively, such that the second adhesive layer 34 can be smoothly separated from the flexible component 50 based on the polymer substrate in removing the transition base 20.

Further, the buffer layer 35 is made of a low thermal conductivity material with a thermal conductivity of less than 0.5, such as glass fiber, polyvinyl chloride (PVC), epoxy resin, etc., to prevent influences on one of the adhesive layers 30 in applying modifying influence factors to the other adhesive layers 30.

In an embodiment, the substrate blank 511 is an organic polymer layer, or includes organic polymer layers and inorganic material layers alternately arranged.

The organic polymer includes one or more flexible polymer materials, such as acrylates, oligomers containing hydroxyl and amino groups, polyimides, polyethylene glycol phthalates, polycarbonates, polyesters (PET) and polydimethylsiloxanes (PDMS) and other materials. The inorganic material may include oxides, nitrides, and/or carbides of one or more of silicon, aluminum, magnesium, zinc, tin, nickel and titanium.

In order to facilitate subsequent mounting of the flexible component 50 based on the polymer substrate by the transition device for the flexible device according to the present disclosure, as shown in FIG. 14, the method further includes forming a device bonding film 57 on the surface of the flexible component 50 based on the polymer substrate away from the transition blank 22, i.e. the first surface 54 of the flexible component 50 for mounting with the flexible base 40. The device bonding film 57 may be a die attach film (DAF). Thus, the transition device for the flexible device can be formed into an attachable device to further reduce the difficulty of mounting the flexible component 50 based on the polymer substrate and of controlling the mounting process, such that mass commercial production of flexible devices can be advantageously performed at a low cost.

The viscosity of the device bonding film 57 is greater than that of the adhesive layer 30, specifically, the viscosity of the first adhesive layer 33, such that the adhesive layer 30 can be peeled from the flexible component 50 based on the polymer substrate in removing the transition base 20, and it is possible to make the bonding between the flexible component 50 based on the polymer substrate and the flexible base 40 more stable.

Further, the method further includes forming an image microstructure (not shown) on a surface of the flexible component 50 based on the polymer substrate away from the transition blank 22 by a laser lithographic printing process, for example. The image microstructure has a cross or circular shape, etc., to facilitate image recognition and alignment, position calibration, angular offset and other operations during the mounting of the flexible device in the subsequent process, and thus to improve the mounting accuracy for the device.

The present disclosure further provides a method for mounting a flexible device using the above mentioned transition device for the flexible device. As shown in FIGS. 16a to 16d, the method includes the following steps:

provide a flexible base 40 and the transition device for the flexible device as described above;

mounting the flexible component 50 based on the polymer substrate in the transition device to the flexible base 40;

removing the transition base 20 and the adhesive layer 30 from the flexible component 50 based on the polymer substrate.

In the above mounting method, by using the transition device for the flexible device according to embodiments of the present disclosure, since the packaging layer 53 and the substrate layer 51 encapsulate the flexible component 50 based on the polymer substrate together and the transition base 20 is fixed on the second surface 55 of the flexible component 50 based on the polymer substrate by the adhesive layer 30, the packaging layer 53 and the substrate layer 51 have flexibility to relieve stress in the flexible component 50 based on the polymer substrate. Moreover, in the mounting process, the transition base 20 can be grasped to move the flexible component 50 based on the polymer substrate, which can reduce the requirements for the equipment accuracy and the workshop environment.

Further, in this method, in order to facilitate subsequent mounting of the flexible component 50 based on the polymer substrate, a device bonding film(s) 57 is formed on a surface of the flexible component 50 based on the polymer substrate for mounting with the flexible base 40 and/or on the flexible base 40. The device bonding film 57 may be a die attach film (DAF). The viscosity of the device bonding film 57 is greater than that of the adhesive layer 30, specially, of the first adhesive layer 33, such that the flexible component 50 based on the polymer substrate can be peeled from the transition base 20 in removing the transition base 20, and it is possible to make the bonding between the flexible component 50 based on the polymer substrate and the flexible base 40 more stable.

Further, in the process of removing the transition base 20 and the adhesive layer 30, the method further includes applying modifying influence factors such as a temperature and/or ultraviolet light to the adhesive layer 30, to reduce the adhesive force between the adhesion layer 30 and the flexible component 50 based on the polymer substrate, and/or increase the adhesive force between the adhesive layer 30 and the transition base 20, such that the transition base 20 can be easily peeled from the flexible component 50 based on the polymer substrate.

The present disclosure further provides a method for fabricating a flexible device, which can be used in the mounting processes of IC chips and flexible components based on polymer substrates at the same time to reduce the requirements of the mounting processes for the equipment accuracy and workshop environment, and facilitate the mass production of devices with the same specification, which is beneficial to the development of the flexible electronic product industry.

In the present disclosure, the IC chips are integrated circuits with substrates made of semiconductor materials such as Si, SiC, GaAs, etc., and flexible components based on flexible polymer substrates are functional components such as capacitors, resistors, sensors, bio-MEMSs or the like with flexible polymer substrates.

As shown in FIG. 17, the present disclosure provides a method for fabricating a flexible device including the following steps:

providing a functional component body 61, such as a silicon-based IC chip, a capacitor, a resistor, a sensor, or a bio-MEMS with a polymer substrate;

forming a packaging layer 62 outside the functional component body 61 to form a functional component 60, in which the functional component 60 has a first surface 64 for mounting with a flexible base 40 and a second surface 65 opposite to the first surface 64;

providing a transition base 20, and bonding the transition base 20 to the second surface 65 of the functional component 60 by an adhesive layer 30 to form a transition device 70;

providing a flexible base 40 and moving the transition device 70 to connect the flexible base 40 with the functional component 60 at the first surface 64 thereof;

peeling the transition base 20 and the adhesive layer 30 to complete the mounting of the functional component 60.

It should be explained that the first surface 64 and the second surface 65 of the above mentioned functional component 60 are determined according to different processes of mounting with the flexible base 40. In a normal chip process, i.e. when a PAD of the functional component 60 is away from the flexible base 40 in the mounting process, a surface of the functional component 60 where the PAD is located is taken as the second surface 65 of the functional component 60 as shown in FIG. 17. At this time, the transition base 20 is disposed on the surface of the functional component 60 where the PAD is located. In a flip chip process, i.e. when the PAD of the functional component 60 faces towards the flexible base 40 in the mounting process, a surface of the functional component 60 where the PAD is located is taken as the first surface 64 of the functional component 60. At this time, the transition base 20 is disposed on a surface of the functional component 60 away from the PAD.

In this embodiment, the packaging layer 62 is formed outside the functional component 60, and the transition base 20 is bonded with the second surface 65 of the functional component 60 to form the transition device 70 for moving and mounting the component device 60. Thus, in the mounting process, it is possible to move the component device 60 by moving the transition device 70, which reduces the requirement for process parameter control. At the same time, the packaging layer 62 formed outside the functional component 60 can buffer stress in the functional component 60 and protect the functional component 60, which can reduce the requirements for the equipment accuracy and workshop environment during the mounting process. Further, regardless of the IC chips with traditional Si, SiC or GaAs substrates or the flexible components based on polymer substrates, it is possible to perform subsequent mounting processes by the transition device 70, such that the mounting of IC chips and the production of the flexible components based on polymer substrates can be performed with the same equipment and the same process, which can make the two processes compatible with the existing SMT technology, and reduce the requirements for the equipment and workshop environment, which is conducive to the development of the flexible electronic product industry.

The packaging layer 62 is formed by an organic polymer or an inorganic material or a mixture thereof, or includes organic polymer layers and inorganic material layers alternately arranged.

The organic polymer includes one or more flexible polymer materials, such as acrylates, oligomers containing hydroxyl and amino groups, polyimides, polyethylene glycol phthalates, polycarbonates, polyesters (PET) and polydimethylsiloxanes (PDMS) and other materials. The thickness of the packaging layer 62 formed by the organic polymer may be in a range of 200 nm to 10000 nm.

The inorganic material may include oxides, nitrides, and/or carbides of one or more of silicon, aluminum, magnesium, zinc, tin, nickel and titanium. The thickness of the packaging layer 62 formed by the inorganic material may be in a range of 5 nm to 600 nm.

In this embodiment, the transition base 20 may be a rigid base, such as a base made of single crystal silicon, glass, ceramic, a rigid polymer material, or a composite material. Preferably, the thickness of the transition base 20 is in a range of 100 μm to 500 μm.

Further, in this embodiment, in order to smoothly peel the adhesive layer 30 and the transition base 20 from the functional component 60, the adhesive layer 30 has a first adhesive surface 31 for bonding with the transition base 20 and a second adhesive surface 32 for bonding with the functional component 60, and the adhesive force between the first adhesive surface 31 and the transition base 20 is greater than that between the second adhesive surface 32 and the functional component 60 by/without applying modifying influence factors to the adhesive layer 30. The above modifying influence factors refer to influencing factors that can change the viscosity of the first adhesive surface 31 or the second adhesive surface 32, such as a specific temperature, light with a specific intensity or wavelength, etc.

Figure 18:
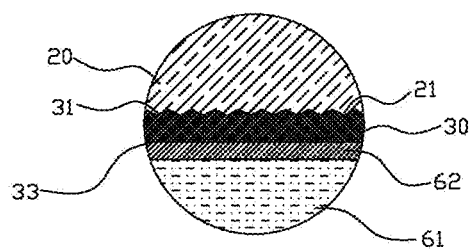
FIG. 18 is a schematic enlarged view of position C in FIG. 17c.

In the first embodiment of the present disclosure, the above mentioned effects can be achieved by increasing the adhesive area of a surface of the transition base 20 in contact with the adhesive layer 30, and/or reducing the adhesive area of a surface of the functional component 60 in contact with the adhesive layer 30. As shown in FIG. 18, a plurality of concave-convex structures 21 for increasing the adhesive area are formed on the surface of the transition base 20 in contact with the adhesive layer 30 to increase the adhesive force between the transition base 20 and the adhesive layer 30. Preferably, a recess in the concave-convex structure 21 may have a depth in a range of 1 μm to 15 μm, and an aspect ratio in a range of 0.5 to 3. When the concave-convex structures 21 have a sawtooth shape, an angle at a top of a zigzag is in a range of 30° to 150°.

Figure 19:
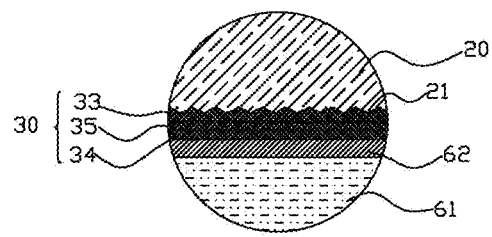
FIG. 19 is a schematic enlarged view of position C in FIG. 17c according to a fifteenth embodiment of the present disclosure.

In other embodiments, as shown in FIG. 19, the adhesive layer 30 at least includes a first adhesive layer 33 in contact with the transition base 20 and a second adhesive layer 34 in contact with the functional component 60, that is, the first adhesive surface 31 is formed between the first adhesive layer 33 and the transition base 20, and the second adhesive surface 32 is formed between the second adhesive layer 34 and the functional component 60. By applying the modifying influence factors, the viscosity of the first adhesive layer 33 can be increased, and/or the viscosity of the second adhesive layer 34 can be reduced.

Based on the above mentioned effects, the first adhesive layer 33 may be formed by a heat sensitive adhesive, where the viscosity of the first adhesive layer 33 is increased by applying a modifying temperature, and the first adhesive layer 33 may also be formed by an ultraviolet sensitive adhesive, where the viscosity of the first adhesive layer 33 may be increased by irradiating with modifying ultraviolet light. The second adhesive layer 34 may be formed by a heat sensitive adhesive, where the viscosity of the second adhesive layer 34 may be reduced by applying a modifying temperature, and the second adhesive layer 34 may also be formed by an ultraviolet sensitive adhesive, where the viscosity of the second adhesive layer 34 may be reduced by irradiating with modifying ultraviolet light.

When the viscosity of the second adhesive layer 34 is reduced by applying modifying influence factors, the first adhesive layer 33 may also be a permanent adhesive, whose viscosity remains unchanged in applying modifying influence factors to the second adhesive layer 34.

As shown in FIG. 19, the adhesive layer 30 further includes a buffer layer 35 disposed between the first adhesive layer 33 and the second adhesive layer 34, and two surfaces of the buffer layer 35 are bonded with the first adhesive layer 33 and the second adhesive layer 34, respectively, such that the second adhesive layer 34 can be smoothly separated from the functional component 60 in removing the transition base 20.

Further, the buffer layer 35 is made of a low thermal conductivity material with a thermal conductivity of less than 0.5, such as glass fiber, polyvinyl chloride (PVC), epoxy resin, etc., to prevent influences on one of the adhesive layers 30 in applying modifying influence factors to the other adhesive layers 30.

Further, based on the above mentioned adhesive layer 30, in the process of removing the transition base 20 and the adhesive layer 30, the method further includes applying modifying influence factors such as a temperature or ultraviolet light to the adhesive layer 30, to reduce the adhesive force between the adhesive layer 30 and the functional component 60, and/or increase the adhesive force between the adhesive layer 30 and the transition base 20, such that the transition base 20 and the adhesive layer 30 may be easily removed from the functional component 60.

Figure 20:
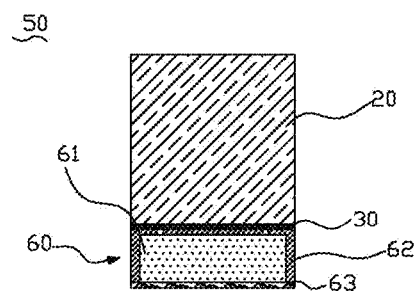
FIG. 20 is a schematic view of a transition device according to a sixteenth embodiment of the present disclosure.
Figure 21A:
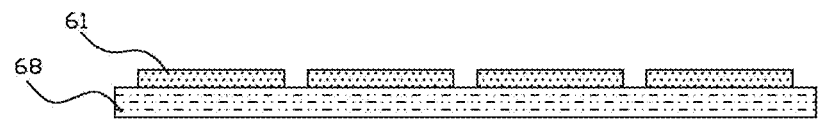
FIGS. 21a to 21d are schematic views of structures obtained in a method for fabricating a flexible device according to a seventeenth embodiment of the present disclosure.
Figure 21B:
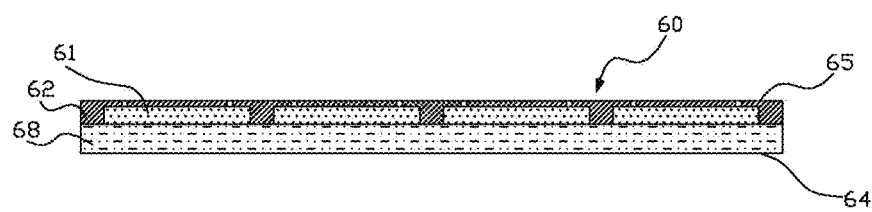
Figure 21C:
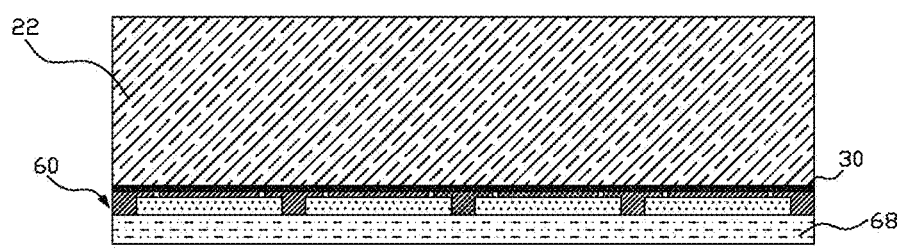
Figure 21D:
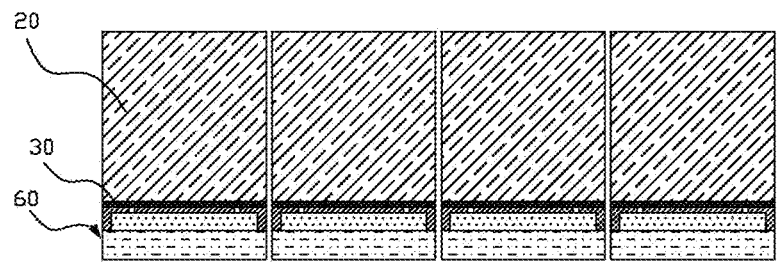
Figure 22A:
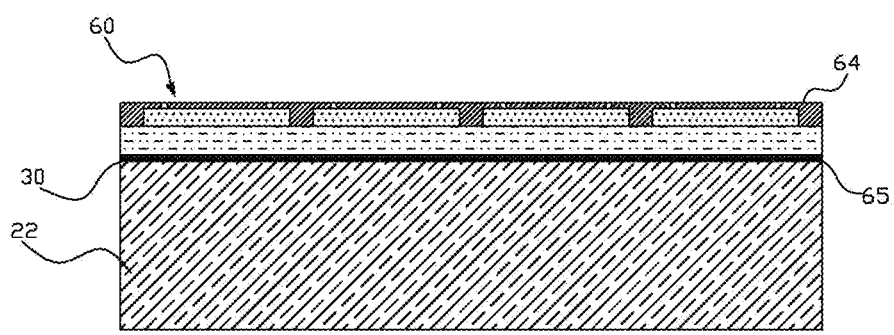
FIGS. 22a to 22b are schematic views of structures obtained in a method for fabricating a flexible device according to an eighteenth embodiment of the present disclosure.
Figure 22B:
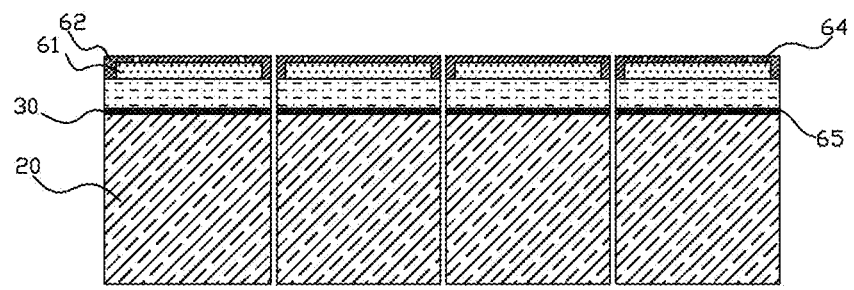

Further, in the step of connecting the flexible base 40 with the functional component 60, the method further includes forming a device adhesive film(s) 63 on the surface of the functional component 60 away from the transition base 20 and/or on a surface of the flexible base 40. FIG. 20 shows a case where the device adhesive film 63 is formed on the functional component 60. In this embodiment, the viscosity of the device adhesive film 63 is greater than that of the adhesive layer 30, specifically, the viscosity of the first adhesive layer 33, such that the adhesive layer 30 can be peeled from the functional component 60 in peeling the transition base 20 and it is possible to make the bonding of the functional component 60 and the flexible base 40 more stable.

Further, as shown in FIGS. 21a to 21d, in order to massively produce the transition device 70, in fabricating the transition device 70, the method further includes:

providing a substrate 68 and a plurality of independent functional component bodies 61 formed on the substrate 68;

encapsulating the functional component bodies 61 on the substrate 68 to form a plurality of functional components 60;

providing a transition blank 22, and bonding the transition blank 22 with the second surface 65 of the functional component 60 by the adhesive layer 30;

dicing the substrate 68 and the transition blank 22 to form a plurality of independent transition devices 70.

Through the above mentioned method, the manufactured transition device 70 can be encapsulated in a tape or tray, so that the subsequent mounting process may be compatible with the SMT process, or compatible with the wafer feeding way in chip encapsulating.

Further, the method further includes forming an image microstructure (not shown) on a surface of the transition blank 22 away from the functional component 60 by a laser lithographic printing process, for example. The image microstructure has a cruciform or circular shape, etc., to facilitate image recognition and alignment, position calibration, angular offset and other operations during the mounting of the flexible device in the subsequent process, and thus to improve the mounting accuracy for the device.

In the present disclosure, the functional component 60 may include flexible components based on flexible polymer substrates, such as capacitors, resistors, sensors, bio-MEMSs or the like, with flexible polymer substrates, and may also include IC chips with Si, SiC, GaAs substrates or the like.

When the functional component 60 is a flexible component based on a polymer substrate, which is applicable to a normal chip process, as shown in FIGS. 21a to 21d, the method of fabricating the flexible component based on the polymer substrate includes the following steps:

providing a substrate 68;

forming a functional component body 61 such as a capacitor, a resistor, a sensor, a bio-MEMS or the like on the substrate 68;

forming a packaging layer 62 on the functional component body 61;

bonding the transition blank 22 to a surface of the functional component 60 away from the substrate 68 by the adhesive layer 30;

dicing the substrate 68 and the transition blank 22 to form a plurality of flexible components 50 based on the polymer substrate applicable to the formal chip process.

Further, in this method, in fabricating the functional component 60, the method further includes thickening a PAD of the functional component 60, and fabricating a flexible electrode on the PAD of the functional component 60, such that the PAD of the functional component 60 is drawn from the packaging layer 62.

Further, in this embodiment, in order to make the functional component 60 flexible, the substrate 68 may be an organic polymer layer, or may include organic polymer layers and inorganic material layers alternately arranged.

The organic polymer includes one or more flexible polymer materials, such as acrylates, oligomers containing hydroxyl and amino groups, polyimides, polyethylene glycol phthalates, polycarbonates, polyesters (PET) and polydimethylsiloxanes (PDMS) and other materials. The inorganic material may include oxides, nitrides, and/or carbides of one or more of silicon, aluminum, magnesium, zinc, tin, nickel and titanium.

When the functional component 60 is a flexible component based on a polymer substrate, which is applicable to a flip chip process, as shown in FIGS. 6a and 6b, the method of fabricating the flexible component based on the polymer substrate includes the following steps:

providing a substrate 68;

forming a functional component body 61 such as a capacitor, a resistor, a sensor, a bio-MEMS or the like on the substrate 68;

forming a packaging layer 62 on the functional component body 61;

bonding the transition blank 22 to a surface of the functional component 60 where the substrate 68 is located by the adhesive layer 30;

dicing the substrate 68 and the transition blank 22 to form a plurality of flexible components 50 based on the polymer substrate applicable to the flip chip process.

In other words, compared with the previous embodiment, in this embodiment, except the bonded location between the transition blank 22 and the functional component 60, other structures can be fabricated by the same step as the previous embodiment.

When the functional component 60 is an IC chip with a Si, SiC or GaAs substrate 68 or the like, which is applicable to a normal chip process, as shown in FIGS. 23a to 23h, the method of fabricating the transition device 70 includes the following steps:

providing a wafer 69, such as a bulk silicon wafer or a SOI wafer;

forming a circuit functional layer 66 on the wafer 69;

dicing the wafer 69 and the circuit functional layer 66 to form a plurality of independent functional component bodies 61 on the wafer;

fabricating a packaging layer 62 to encapsulate the functional component bodies 61 to form a plurality of functional components 60;

bonding the transition blank 22 to a surface of the functional component 60 where the circuit functional layer 66 is located by the adhesive layer 30;

dicing the transition blank 22 to form a plurality of transition devices 70 for IC chips applicable to the normal chip process.

Further, in fabricating the circuit functional layer 66 on the wafer 69, it is also necessary to thicken a PAD of the functional component body 61, and fabricate a flexible electrode on the PAD of the functional component 60. The flexible electrode may include nanomaterials such as Au, Ag or C, or a viscous mixture formed by nanomaterials such as Au, Ag or C and polymers, such that the PAD of the wafer 69 can be drawn from the packaging layer 62.

In this embodiment, for example, the wafer 69 and the circuit functional layer 66 can be diced by etching, mechanical cutting, or laser cutting to form a plurality of independent functional components 60.

In this method, after bonding the transition blank 22 to the surface of the functional component 60 where the circuit functional layer 66 is located by the adhesive layer 30, the method may further include thinning a surface of the wafer away from the functional component 60 to reduce the thickness of the functional component 60. In this embodiment, the wafer can be thinned by mechanical grinding, etching, etc., such that the thickness of the functional component body 61 is less than 80 μm.

Figure 23A:
FIGS. 23a to 23h are schematic views of structures obtained in a method for fabricating a flexible device according to a nineteenth embodiment of the present disclosure.
Figure 23B:
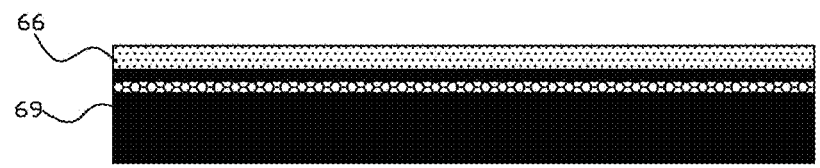
Figure 23C:
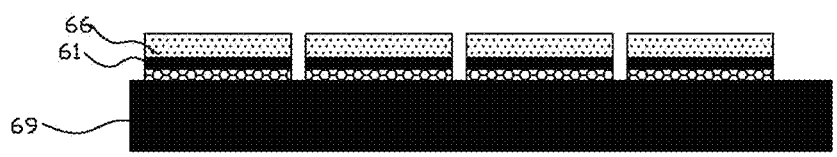
Figure 23D:
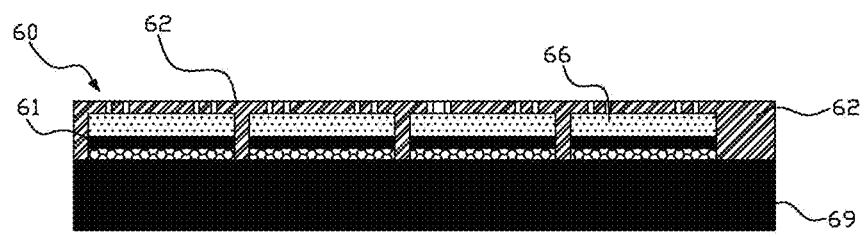
Figure 23E:
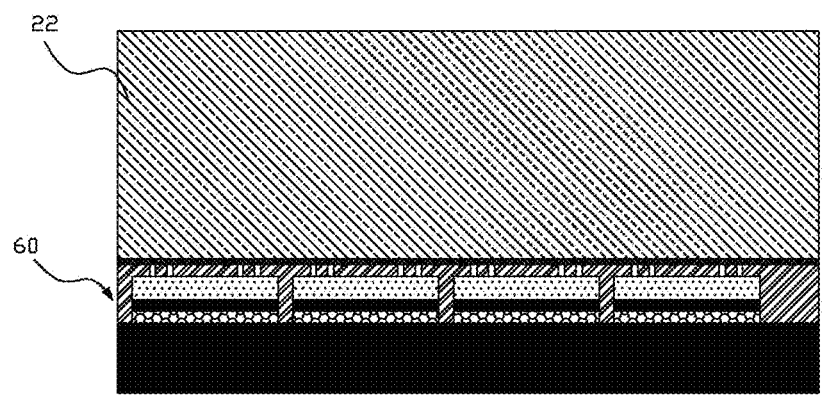
Figure 23F:
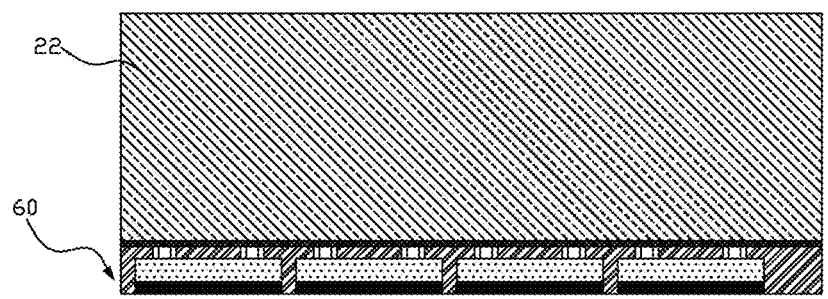
Figure 23G:
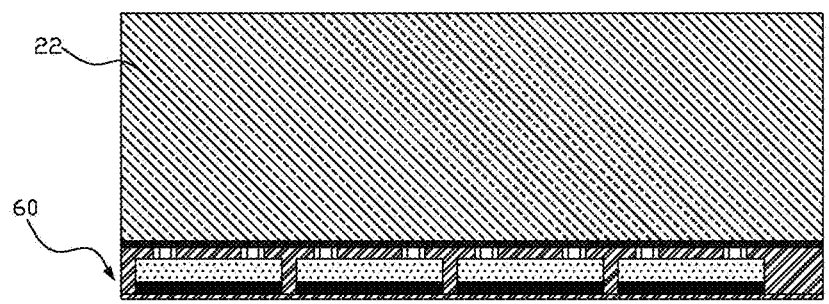
Figure 23H:
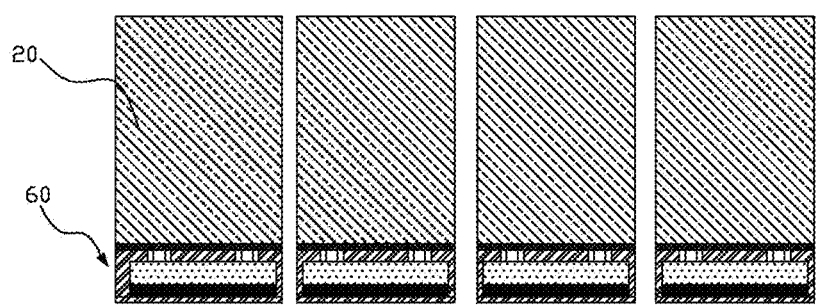
Figure 24A:
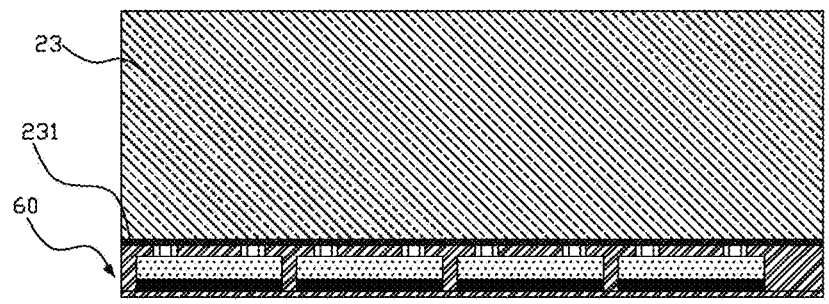
FIGS. 24a to 24c are schematic views of structures obtained in a method for fabricating a flexible device according to a twentieth embodiment of the present disclosure.
Figure 24B:
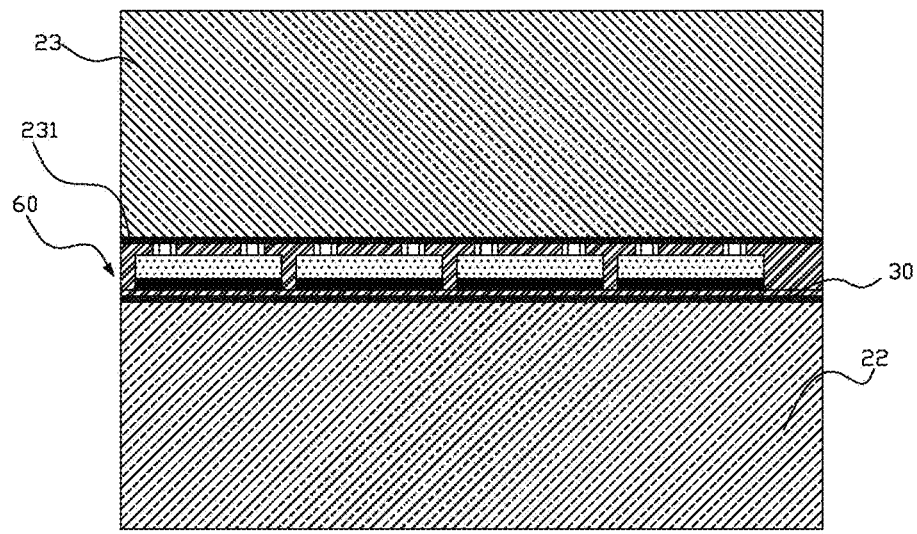
Figure 24C:
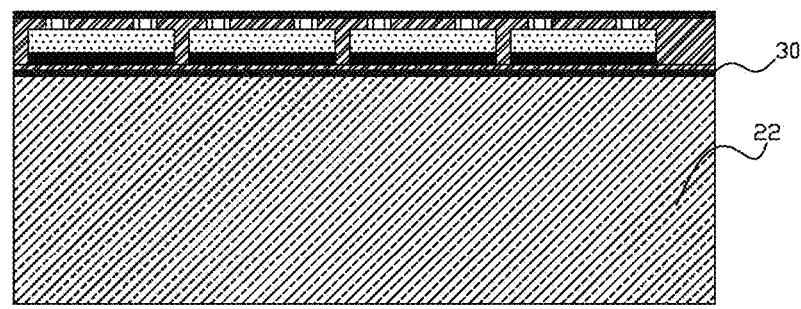
Figure 25:
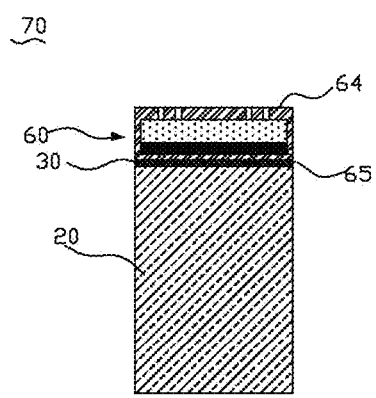
FIG. 25 is a schematic view of a transition device according to a twenty-first embodiment of the present disclosure.

Further, as shown in FIGS. 23e and 7f, taking an IC chip with a SOI substrate as an example, in dicing the wafer 69, only a top silicon layer and a buried oxide layer can be diced. During the thinning process, a silicon substrate and the buried oxide layer are completely removed to reduce the thickness of the functional component 60 as much as possible.

Further, after the thinning process, for example, the method may further include performing dry etching or dry polishing on the thinned surface of the IC chip body to eliminate residual stress on the surface.

Further, after the thinning process, the method further includes encapsulating the functional component 60 on the thinned surface thereof, such that the packaging layer 62 can completely wrap the functional component 60.

When the functional component 60 is an IC chip with a Si, SiC or GaAs substrate 68 or the like, which is applicable to a flip chip process, the method of fabricating the transition device 70 includes the following steps:

providing a wafer 69, such as a bulk silicon wafer or a SOI wafer;

forming a circuit functional layer 66 on the wafer 69;

dicing the wafer 69 and the circuit functional layer 66 to form a plurality of independent functional component bodies 61 on the wafer 69;

fabricating a packaging layer 62 to encapsulate the functional component bodies 61 to form a plurality of functional components 60 on the wafer 69;

bonding the transition blank 22 to a surface of the functional component 60 away from the circuit functional layer 66 by the adhesive layer 30;

dicing the transition blank 22 to form a plurality of transition devices 70 for IC chips applicable to the flip chip process.

In other words, compared with the previous embodiment, in this embodiment, except the bonded location of the transition blank 22, other structures can be fabricated by the same step as the previous embodiment.

In another embodiment, in thinning the IC chip applicable to the flip chip process, after fabricating the packaging layer 62 to encapsulate the functional component 60, the method further includes:

providing an adapter plate 23, and bonding the adapter plate 23 to a surface of the functional component 60 where the circuit functional layer 66 is located by an adapter adhesive layer 231;

thinning a surface of the wafer 15 away from the functional component 60;

bonding the transition blank 22 to a surface of the functional component 60 away from the circuit functional layer 66 by the adhesive layer 30;

peeling the adapter plate 23 from the functional component 60.

That is, by providing the adapter plate 23, the surface of the wafer 69 away from the functional component 60 is thinned using the adapter plate 23 as a substrate, and then the transition blank 22 is bonded with the surface of the functional component 60 away from the circuit functional layer 66.

In this embodiment, in order to smoothly separate the adapter plate 23 and the adapter adhesive layer 231 from the functional component 60, in this embodiment, the adhesion force between the adapter adhesive layer 231 and the functional component 60 is smaller than that between the adhesive layer 30 and the functional component 60.

In this embodiment, the same equipment and the same process can be used to mount various functional components 60 on the flexible base 40. After the various functional components are mounted on the flexible base 40, the method further includes disposing lines between the functional components 60, and disposing an outer packaging layer 62 outside the functional components 60, the lines and the flexible base 40. It is possible to dispose the lines and the outer packaging layer 62 according to known technologies, which will be omitted here.

The above description is only the preferred embodiments of the present disclosure, but is not intended to limit the present disclosure in any form. While the present disclosure has been described by way of example and in terms of preferred embodiments, it is to be understood that the present disclosure is not limited thereto. Those skilled in the art can still make various alterations and modifications without departing from the scope of the present disclosure. All the simple modifications, changes and alterations of the above embodiments according to the contents of the present disclosure shall be within the protection scope of the present disclosure.

INDUSTRIAL APPLICABILITY

With the transition device for the flexible device according to the present disclosure, the transition base is bonded with the second surface of the functional component, and the transition device for the flexible device is compatible with the existing SMT technology. Alternatively, in the wafer feeding way for chip encapsulating, the transition device can be directly applied to the mounting process of functional components, which reduces the difficulty of mounting process control of the mounting equipment for functional components in the mounting process to facilitate the mounting of functional components. At the same time, since the packaging layer is formed on the functional components, the transition base is bonded to the packaging layer by the adhesive layer. On the one hand, since the packaging layer is provided, it is possible to bond or peel the adhesive layer to or from the functional components without damage to the functional components. On the other hand, in moving the transition device, the packaging layer can protect the functional components and buffer the stress therein, and prevent external dust, static electricity and the like from affecting the functional components, which reduces the difficulty of storage, transportation and subsequent mounting of functional components. Finally, in mounting the functional components, the functional components are protected by the packaging layer, which can reduce the requirements of the mounting process on the workshop environment and equipment accuracy, such that the transition device for the flexible device can circulate in the mounting industry of the functional components as an independent product, which is conducive to the customized production of ultra-thin electronic devices by downstream manufacturers and the development of the flexible device industry.

What is claimed is:

1. A transition device for a flexible device, comprising:
a functional component and a transition base;
wherein the functional component has a first surface for mounting with a base and a second surface opposite to the first surface, and the transition base is bonded to the second surface of the functional component by an adhesive layer;
wherein the adhesive layer comprises a first adhesive layer in contact with the transition base and a second adhesive layer in contact with the functional component;
wherein the adhesive layer further comprises a buffer layer disposed between the first adhesive layer and the second adhesive layer, and two surfaces of the buffer layer are bonded with the first adhesive layer and the second adhesive layer, respectively;
wherein the buffer layer is made of a low thermal conductivity material with a thermal conductivity of less than 0.5.

2. The transition device according to claim 1, wherein:
the functional component comprises a functional component body and a packaging layer;
the functional component body comprises a substrate and a functional layer formed at a surface of the substrate; and
the packaging layer is at least disposed on a surface of the functional layer.

3. The transition device according to claim 2, wherein:
the functional component is applicable to a normal chip process, the transition base is bonded with the functional component at the second surface thereof where the functional layer is located by the adhesive layer.

4. The transition device according to claim 3, wherein:
the functional component body comprises an IC chip substrate and a circuit functional layer formed on the IC chip substrate;
the packaging layer encapsulates the IC chip substrate and the circuit functional layer at least from a surface of the circuit functional layer and a side of the IC chip; and
the transition base is bonded with the IC chip at a surface thereof where the circuit functional layer is located by the adhesive layer.

5. The transition device according to claim 2, wherein the functional component is a flexible component based on a polymer substrate, the functional component comprises a substrate layer and a device functional layer disposed on the substrate layer, and the device functional layer is encapsulated by the packaging layer; and
wherein one of the following:
the flexible component based on the polymer substrate is applicable to a normal chip process, and the transition base is bonded with the flexible component based on the polymer substrate at a surface thereof where the device functional layer is located by the adhesive layer; or
the flexible component based on the polymer substrate is applicable to a flip chip process, and the transition base is bonded with the flexible component based on the polymer substrate at a surface thereof where the substrate layer is located by the adhesive layer.

6. The transition device according to claim 1, wherein the adhesive layer has a first adhesive surface for bonding with the transition base and a second adhesive surface for bonding with the functional component, and the adhesive force between the first adhesive surface and the transition base is greater than that between the second adhesive surface and the functional component.

7. The transition device according to claim 6, wherein a plurality of concave-convex structures for increasing an adhesive area are formed on the transition base, and located on a surface of the transition base in contact with the adhesive layer.

8. The transition device according to claim 6, wherein the first adhesive surface is formed between the first adhesive layer and the transition base, and the second adhesive surface is formed between the second adhesive layer and the functional component.

9. The transition device according to claim 8, wherein in applying modifying influence factors to the adhesive layer, the viscosity of the first adhesive layer is increased, and/or the viscosity of the second adhesive layer is reduced, such that the viscosity of the first adhesive layer is greater than that of the second adhesive layer.

10. The transition device according to claim 2, wherein:
the functional component is applicable to a flip chip process, and the transition base is bonded with the functional component at the second surface thereof away from the functional layer by the adhesive layer.

11. The transition device according to claim 10, wherein:
the functional component body comprises an IC chip substrate and a circuit functional layer formed on the IC chip substrate;
the packaging layer encapsulates the IC chip substrate and the circuit functional layer at least from a surface of the circuit functional layer and a side of the IC chip; and
the transition base is bonded with the IC chip at a surface thereof away from the circuit functional layer by the adhesive layer.

12. A method for producing a transition device for a flexible device, comprising:
providing a functional component body;
forming a packaging layer outside the functional component body to form a functional component, the functional component having a first surface for mounting with a flexible base and a second surface opposite to the first surface; and
providing and bonding a transition base to the second surface of the functional component by an adhesive layer;
wherein the adhesive layer comprises a first adhesive layer in contact with the transition base and a second adhesive layer in contact with the functional component;
wherein the adhesive layer further comprises a buffer layer disposed between the first adhesive layer and the second adhesive layer, and two surfaces of the buffer layer are bonded with the first adhesive layer and the second adhesive layer, respectively;

wherein the buffer layer is made of a low thermal conductivity material with a thermal conductivity of less than 0.5.

13. The method according to claim 12, wherein the functional component is an IC chip, the method comprising:
providing a wafer and forming a circuit functional layer on the wafer;
dicing the wafer to form a plurality of IC chip substrates and a functional component body of the circuit functional layer on the IC chip substrate;
encapsulating the functional component body to form the IC chip, wherein the IC chip has a first surface for mounting with a base and a second surface opposite to the first surface;
providing and bonding a transition blank to the second surface of the IC chip by the adhesive layer; and dicing the transition blank.

14. The method according to claim 12, wherein the functional component is a flexible component based on a polymer substrate, the method comprising:
providing a substrate blank and forming a plurality of device functional layers on the substrate blank;
encapsulating the device functional layer to form a flexible component blank based on the polymer substrate, the flexible component blank having a first surface for mounting with a base and a second surface opposite to the first surface;
providing and bonding a transition blank to the second surface of the flexible component blank based on the polymer substrate; and
dicing the flexible component blank based on the polymer substrate to form flexible components based on the polymer substrate.

15. The method according to claim 13, wherein the adhesive layer has a first adhesive surface for bonding with the transition blank and a second adhesive surface for bonding with the flexible component based on the polymer substrate, and the adhesive force between the first adhesive surface and the transition blank is greater than that between the second adhesive surface and the functional component.

16. The method according to claim 14, wherein the adhesive layer has a first adhesive surface for bonding with the transition blank and a second adhesive surface for bonding with the flexible component based on the polymer substrate, and the adhesive force between the first adhesive surface and the transition blank is greater than that between the second adhesive surface and the functional component.

17. A method for fabricating a flexible device, comprising:
providing a transition device for a flexible device, the transition device comprising a functional component and a transition base, wherein the functional component has a first surface for mounting with a base and a second surface opposite to the first surface, and the transition base is bonded to the second surface of the functional component by an adhesive layer;
providing a flexible base and moving the transition device to connect the flexible base with the functional component at the first surface thereof; and
mounting the first surface of the functional component in the transition device of the flexible device on the flexible base, and peeling the transition base and the adhesive layer;
wherein the adhesive layer comprises a first adhesive layer in contact with the transition base and a second adhesive layer in contact with the functional component;
wherein the adhesive layer further comprises a buffer layer disposed between the first adhesive layer and the second adhesive layer, and two surfaces of the buffer layer are bonded with the first adhesive layer and the second adhesive layer, respectively;
wherein the buffer layer is made of a low thermal conductivity material with a thermal conductivity of less than 0.5.

18. The method according to claim 17, wherein the adhesive layer has a first adhesive surface for bonding with the transition base and a second adhesive surface for bonding with the functional component, and the adhesive force between the first adhesive surface and the transition base is greater than that between the second adhesive surface and the functional component.

19. The method according to claim 18, wherein:
in applying modifying influence factors to the adhesive layer, the adhesive force between the first adhesive surface and the transition base is greater than that between the second adhesive surface and the functional component;
the first adhesive surface is formed between the first adhesive layer and the transition base, and the second adhesive surface is formed between the second adhesive layer and the functional component; and
in removing the transition base and the adhesive layer, by applying modifying influence factors to the adhesive layer, the viscosity of the first adhesive layer is increased, and/or the viscosity of the second adhesive layer is reduced, such that the viscosity of the first adhesive layer is greater than that of the second adhesive layer;
wherein one or more of the following:
the first adhesive layer is formed by a heat sensitive adhesive, where the viscosity of the first adhesive layer is increased by application of a temperature; and/or
the second adhesive layer is formed by a heat sensitive adhesive, where the viscosity of the second adhesive layer is reduced by application of a temperature.

20. The method according to claim 19, wherein one or more of the following:
the first adhesive layer is formed by an ultraviolet sensitive adhesive, where the viscosity of the first adhesive layer is increased by irradiating with ultraviolet light;
the second adhesive layer is formed by an ultraviolet sensitive adhesive, where the viscosity of the second adhesive layer is reduced by irradiating with ultraviolet light; and
the viscosity of the second adhesive layer is reduced by applying modifying influence factors, and the first adhesive is a permanent adhesive.

21. The method according to claim 19, in removing the transition base and the adhesive layer, further comprising applying modifying influence factors to the adhesive layer to reduce the adhesive force between the adhesive layer and the functional component, and/or increase the adhesive force between the adhesive layer and the transition base.

* * * * *